US 8,521,095 B2

(12) United States Patent
Harvey

(10) Patent No.: US 8,521,095 B2
(45) Date of Patent: Aug. 27, 2013

(54) SYSTEM AND METHOD FOR INTRA-CABINET WIRELESS COMMUNICATION

(76) Inventor: Paul J. Harvey, Toronto (CA)

( * ) Notice: Subject to any disclaimer, the term of this patent is extended or adjusted under 35 U.S.C. 154(b) by 1664 days.

(21) Appl. No.: 11/865,272

(22) Filed: Oct. 1, 2007

(65) Prior Publication Data

US 2012/0214415 A1    Aug. 23, 2012

(51) Int. Cl.
     *H04B 17/00*      (2006.01)
(52) U.S. Cl.
     USPC ............. 455/67.12; 455/41.2; 455/226.1; 455/67.11; 455/423; 361/38; 361/142
(58) Field of Classification Search
     USPC ............ 455/41.2, 226.1, 67.11, 67.12, 423; 361/38, 142; 370/241, 338
See application file for complete search history.

(56) References Cited

U.S. PATENT DOCUMENTS

| | | | |
|---|---|---|---|
| 6,088,582 A * | 7/2000 | Canora et al. ............. | 455/226.1 |
| 6,903,910 B1 * | 6/2005 | Griesing et al. ............. | 361/38 |
| 7,075,893 B1 * | 7/2006 | Mlinarsky et al. ............. | 370/241 |

* cited by examiner

Primary Examiner — April G Gonzales

(57) ABSTRACT

A system, method and apparatus is provided for linking an assembly of electronic components disposed inside a cabinet for wireless communication therebetween. The method consists of (a) selecting a plurality of the electronic components for inter-communication therebetween, and linking each of the plurality of electronic components, directly or indirectly, to a wireless multi-link device, the wireless multi-link device including one or more radiating elements; (b) providing an RF/microwave chamber within or adjacent to the cabinet, the dimensions of which are optimized to promote signal propagation inside the RF/microwave chamber, whereby the RF/microwave chamber is operable to substantially confine signals emitted by the radiating elements within the RF/microwave chamber; (c) confining the radiating elements within the RF/microwave chamber; (d) connecting the wireless multi-link devices to a wireless medium that is operable within an air medium of the RF/microwave chamber; and (e) activating the wireless multi-link devices to inter-communicate via the wireless medium by operation of the radiating elements. The RF/microwave chamber dimensions are optimized so that the minimum cross-sectional dimensions perpendicular to and averaged over each possible signal trajectory within the RF/microwave chamber are greater than or substantially equal to lambda/2. The system consists of a wireless-linking system for enabling electronic components disposed inside, a cabinet to inter-communicate wirelessly, the system including a plurality of wireless multi-link devices and the RF/microwave chamber. A wireless transceiver is also provided for managing wireless inter-connection between the wireless multi-link devices.

38 Claims, 26 Drawing Sheets

SYSTEM AND METHOD FOR INTRA-CABINET WIRELESS COMMUNICATION

FIELD OF THE INVENTION

This invention relates in general to technologies for broadband wireless component cabinets. This invention relates more particularly to systems and methods for enabling wireless communication between broadband network components within a cabinet.

BACKGROUND OF THE INVENTION

Communication equipment in telecom, datacom, professional audio and video, and harsh environments is typically designed to be installed within one or more cabinets, of the type illustrated in FIG. 1. Each cabinet usually conforms to the EIA (Electronics Industry Association) standard width of 19 or 23 inches and houses a multitude of card cages or rack units. Rack units in turn house a number of circuit pack modules (also referred to as electronic circuit packs). A representative rack unit is also illustrated in FIG. 7a.

Each rack unit and/or circuit pack module within a rack unit typically requires the establishment of a multitude of communication links to effect intra-cabinet communication among collocated equipment. Traditionally, this intra-cabinet communication has been physically established using either electrical or optical interconnect cables (as illustrated in FIG. 1), and usually creating from such cables well known network topologies including star, ring, bus, and mesh. Cable systems, however, suffer from a number of shortcomings. Use of electrical or optical interconnect cables in many implementations results in cable clutter, which obstructs air flow for cooling, and interferes with moves/adds/changes. The complex cable arrangements involved typically require skilled technicians to install and maintain them over the course of their life. Electrical cables do not offer catastrophic fault isolation from surges, immunity to ground loop EMI (Electromagnetic Interference), nor immunity to common mode range issues associated with ground referenced systems. The optical connectors and transceivers used in such cable systems for providing intra-cabinet communication are generally relatively costly. The optical and electrical cables and cable harness assemblies that are used are typically made specifically for the particular cabinet and for its installed racks, card cages, and circuit pack modules. As a result these components generally: (A) increase commissioning time and complexity, and (B) Require specialized knowledge for installation, maintenance, and moves/adds/changes. On occasion, connector pins and threads can be become damaged if improperly installed resulting in costly field repair work. Optical and electrical cables used generally employ mechanical connectors that are sensitive to relatively common environmental factors such as dust, humidity, sea salt, temperature, thermal cycling and vibration.

What is needed therefore is a system and method for providing wireless communication between the aforesaid components in a cabinet.

U.S. Pat. No. 6,771,935 ('935) issued to Leggett discloses a wireless bus that replaces the hard-wired mid plane bus utilized in a standard telecommunication switch. Rather than using the usual wired connections between the mid plane bus and the various circuit boards or cards, a plurality of radio frequency antennae or probes are used for each such circuit board or card. The antennae or probes project into a common waveguide. By virtue of this arrangement, each circuit board or card is operable to communicate with the other circuit boards or cards on predetermined radio channels. '935 also discloses containment of the cards and their antennae within a conductive enclosure to permit wireless communication between components separated by intervening objects.

One disadvantage of the technology disclosed in '935 is that reflection of incident electromagnetic radiation off of the walls of the disclosed waveguide will generally result in multi path distortion. '935 does not disclose adequate means for mitigating such multi path distortion. The invention described in '935 could lead to a high number of sustained reflections of the electromagnetic radiation and therefore the communication channel capacity will be limited and/or the complexity of the required receiver will be significantly greater.

Also, it should be noted that '935 focuses on back plane/mid plane substitutive technology. Mid plane and back plane structures are typically constructed from Printed Circuit Board ("PCB") materials and are generally limited in size to less than 60 cm×50 cm. These mid plane and back plane structures are usually integrated into a rack mount card cage that is subsequently installed within a cabinet. As stated earlier, a cabinet typically contains a number of these rack units that need to intercommunicate. The '935 technology therefore addresses intra-card cage communication only, whereas there is a need for a technology that provides wireless communication between multiple points throughout the interior of the cabinet, including between the various components whether the are located on the same or different card cages.

It is also noted neither '935 nor any other prior art address the issue of bandwidth management within the cabinet.

What is needed therefore is a system and method for providing intra-cabinet communication between the various broadband network components. A system and method is required that enables wireless communication between the various broadband network components located throughout the interior of the cabinet, while minimizing the effects of multi-path signal distortion. A system and method is also required that enables the deployment of wireless intra-cabinet communication that is easy to implement, and requires relatively inexpensive components. Also, there is a need for a system and method that permits efficient allocation of channel resources across domains, including SDMA, FDMA, TDMA, CDMA and PDMA domains (defined below), within the confines of the cabinet.

SUMMARY OF THE INVENTION

The present invention provides a solution for enabling intra-cabinet communication between the various components stored in a cabinet.

In one aspect thereof, the present invention provides a wireless multi-linking system for enabling electronic components disposed inside a cabinet to inter-communicate wirelessly, the system comprising: (a) a plurality of wireless multi-link, devices linked, directly or indirectly, to a plurality of the electronic components, the wireless multi-link devices including one or more radiating elements; and (b) an RF/microwave chamber within or adjacent to the cabinet wherein at least one dimension of the RF/microwave chamber is greater than ½ the wavelength of the lowest signal frequency of each of the wireless multi-link devices at their range of operation, wherein the RF/microwave chamber is disposed so as to confine the radiating elements and is operable to substantially confine signals emitted by the radiating elements within the RF/microwave chamber; wherein the wireless multi-link devices are operable to connect to a wireless medium provided within the RF/microwave chamber and to inter-communicate via the wireless medium by operation of the radiating elements, thereby enabling inter-communication between the plurality of electronic components.

The RF/microwave chamber of the present invention can either be provided in existing cabinets, or new cabinets can be manufactured such that they include or accommodate the RF/microwave chamber of the present invention.

A number of different embodiments of the RF/microwave chamber are also provided to adapt to different conditions inside the cabinet, and also to provide different arrangements of the RF/microwave chamber to facilitate increased intra-cabinet communication capacity and to reduce multi-path signal distortion.

In another aspect of the invention, a method is provided for linking electronic components disposed inside a cabinet for wireless communication therebetween. This method can be used in providing cabinets that include the RF/microwave chamber of the present invention, or to modify existing cabinets to include the RF/microwave chamber.

In another aspect of the present invention, a wireless transceiver is provided that is operable to manage wireless interconnection between a plurality of wireless electronic components, including in the RF/microwave chamber air medium.

In a still other aspect of the present invention a new circuit card is provided that includes the wireless transceiver. A further aspect of the present invention is a circuit card that includes the wireless transceiver and also a radiating unit for providing intra-cabinet communication within the RF/microwave chamber.

The RF/microwave chamber and the wireless transceiver of the present invention can be utilized in environments other than a cabinet where wireless communication between wired components is desirable.

BRIEF DESCRIPTION OF THE DRAWINGS

A detailed description of the preferred embodiment(s) is (are) provided herein below by way of example only and with reference to the following drawings, in which:

FIG. 5b is a cross-sectional view of the embodiment illustrated in FIG. 5a;

FIG. 13b another particular embodiment of the invention in which multiple RF/microwave chambers are connected, in this case via a passive interconnect of two RF/microwave chambers with a coax or waveguide and a passive bandpass filter there between;

Figure 1:
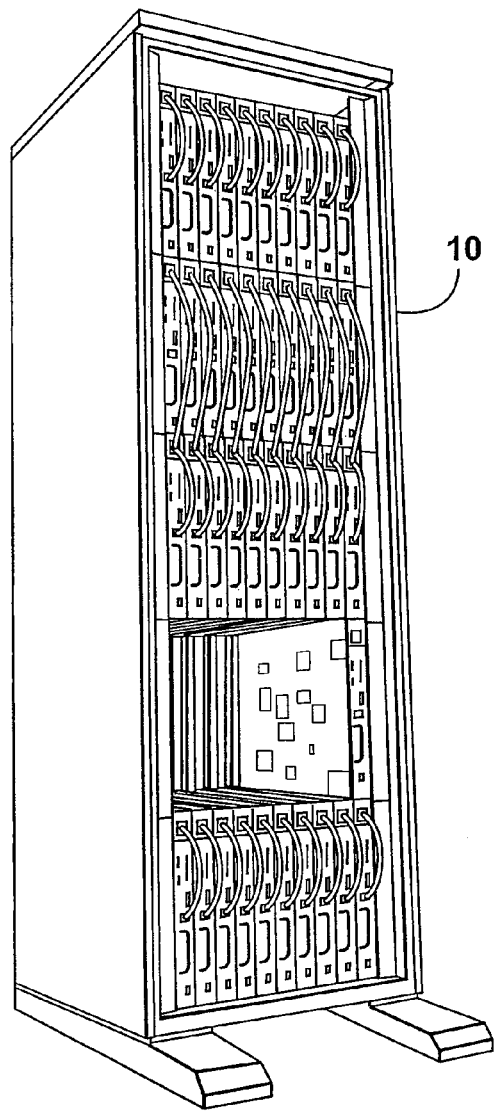
FIG. 1 is a front perspective view illustrating the principal physical features of a cabinet for broadband network components.

In the drawings, preferred embodiments of the invention are illustrated by way of example. It is to be expressly understood that the description and drawings are only for the purpose of illustration and as an aid to understanding, and are not intended as a definition of the limits of the invention.

DETAILED DESCRIPTION OF THE PREFERRED EMBODIMENT

Cabinet

Figure 2:
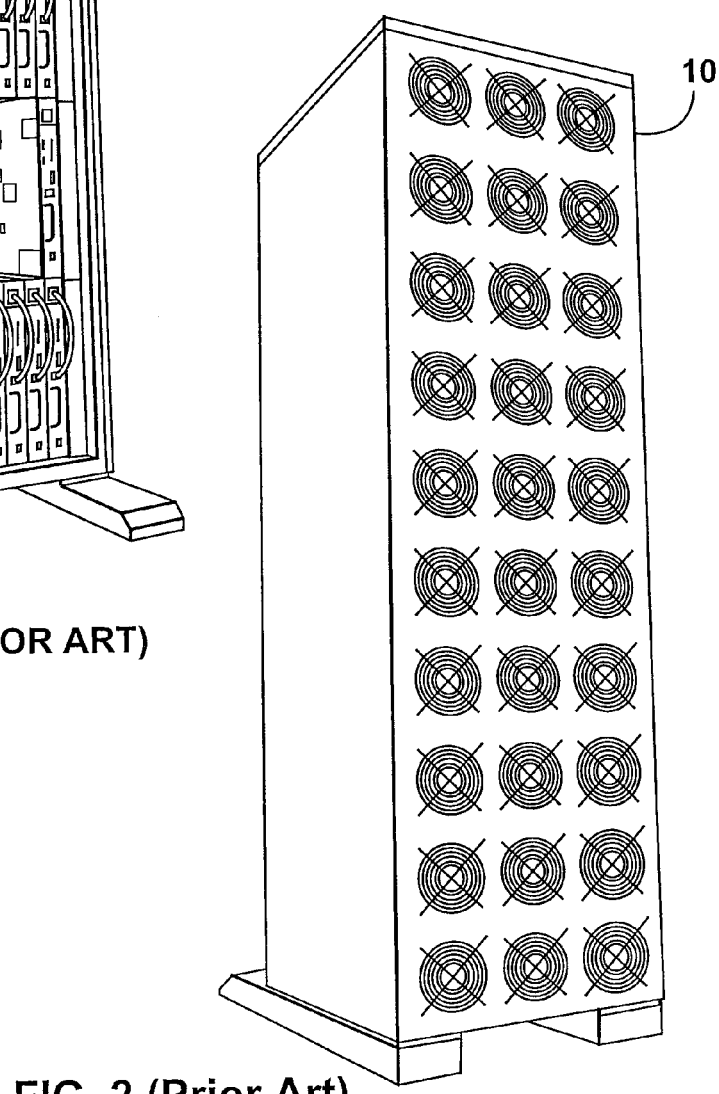
FIG. 2 is a back perspective view further illustrating the principal physical features of a cabinet for broadband network components.

One aspect of the present invention, is a cabinet (10) of the type illustrated in FIGS. 1 and 2, but having the features described in this disclosure. One aspect of cabinet (10) is that it includes an RF/microwave chamber (12) that generally provides a three-dimensional RF shielded environment, namely the RF/microwave chamber (12), is operable to confine electromagnetic signals of interest within the chamber. Specifically, in one particular embodiment of the RF/microwave chamber (12): (A) external ambient signals are kept from penetrating and hence contaminating the internal signal environment within the RF/microwave chamber (12), and (B) internal signals are prevented from escaping the RF/microwave chamber (12) and hence contaminating the external environment.

It should be understood that the present disclosure refers to an RF/microwave "chamber" to describe a structure that is operable to confine electromagnetic signals. In most applications the chamber will be three-dimensional and will enclose the radiating units described below. The RF/microwave chamber, however, is also meant to include variations on such a structure which may not completely enclose the radiating unit, yet the structure is nonetheless operable to confine signals within the area of the radiating units. For example, it is possible to imagine a structure that includes a pair of parallel plates that are operable to maintain electromagnetic energy within an area defined on the opposing surfaces of such parallel plates. It is also possible that the walls of the RF/microwave chamber could include openings or gaps, so long as the RF/microwave chamber is operable to confine the electromagnetic signals. Such structures would still be considered as being encompassed by the RF/microwave chamber of the present invention, although other alternate embodiments described in this invention are preferred.

Figure 7A:
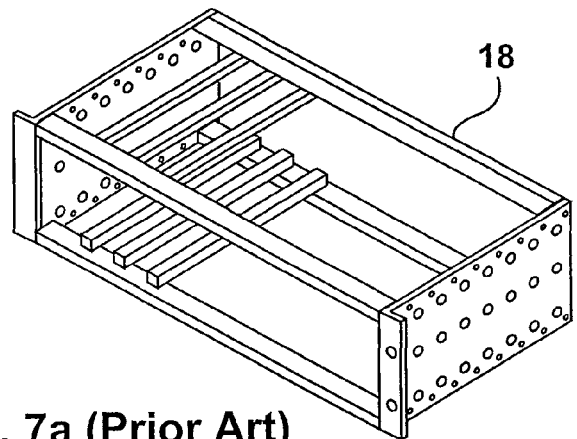
FIG. 7a illustrates a representative card cage.
Figure 7B:
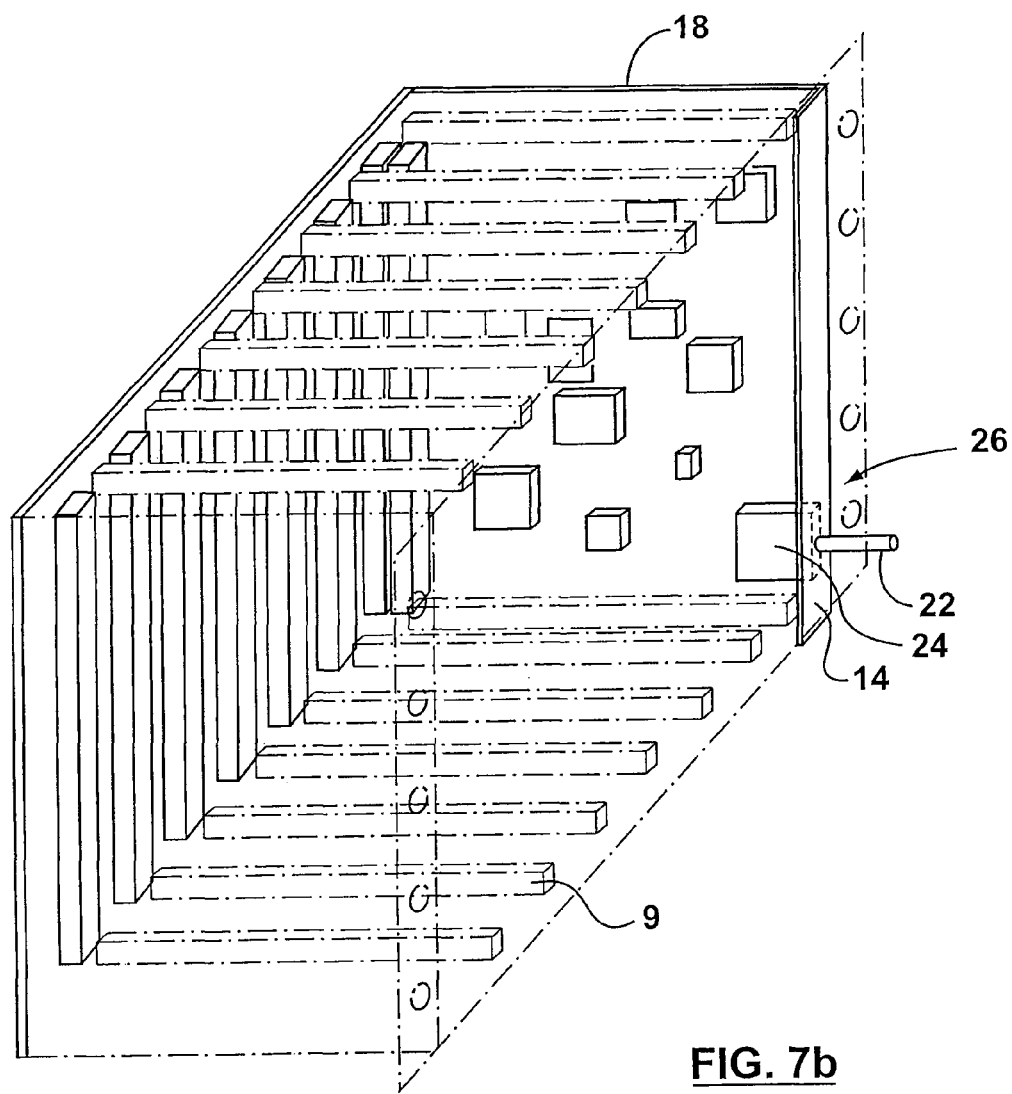
FIG. 7b in a perspective view illustrates a PCB card that plugs into a backplane rack mount card cage, in which the intra-cabinet wireless transceiver of the present invention is mounted on the PCB card.
Figure 7C:
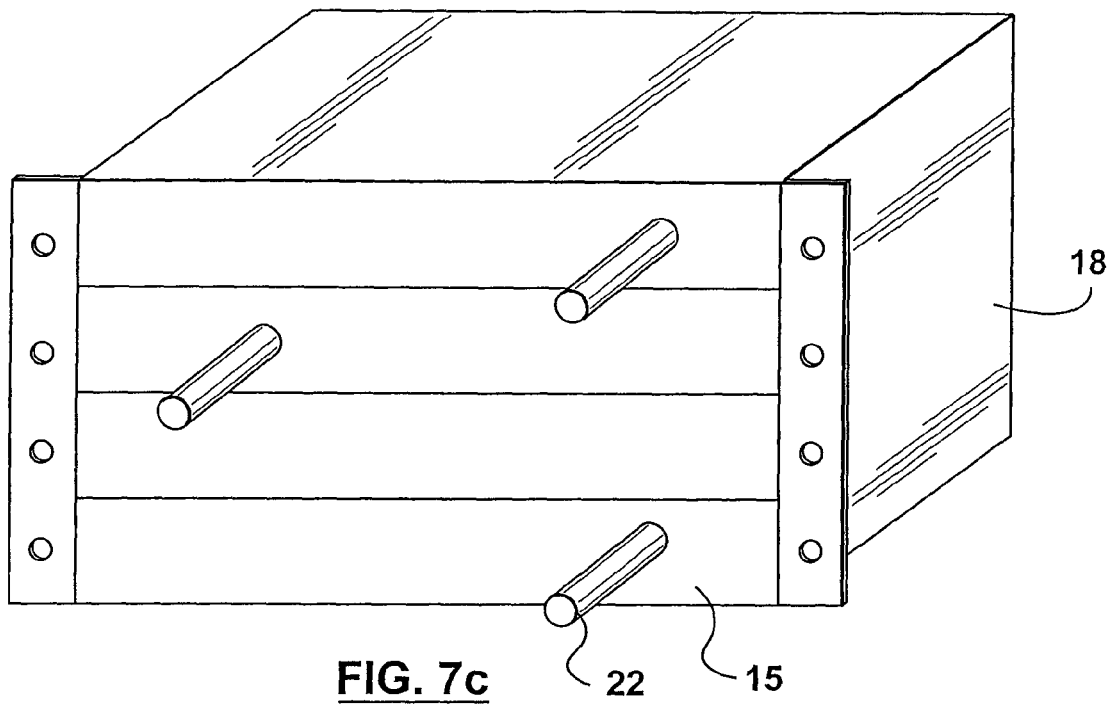
FIG. 7c illustrates circuit packs mounted horizontally within a card cage for placement in the cabinet.
Figure 7D:
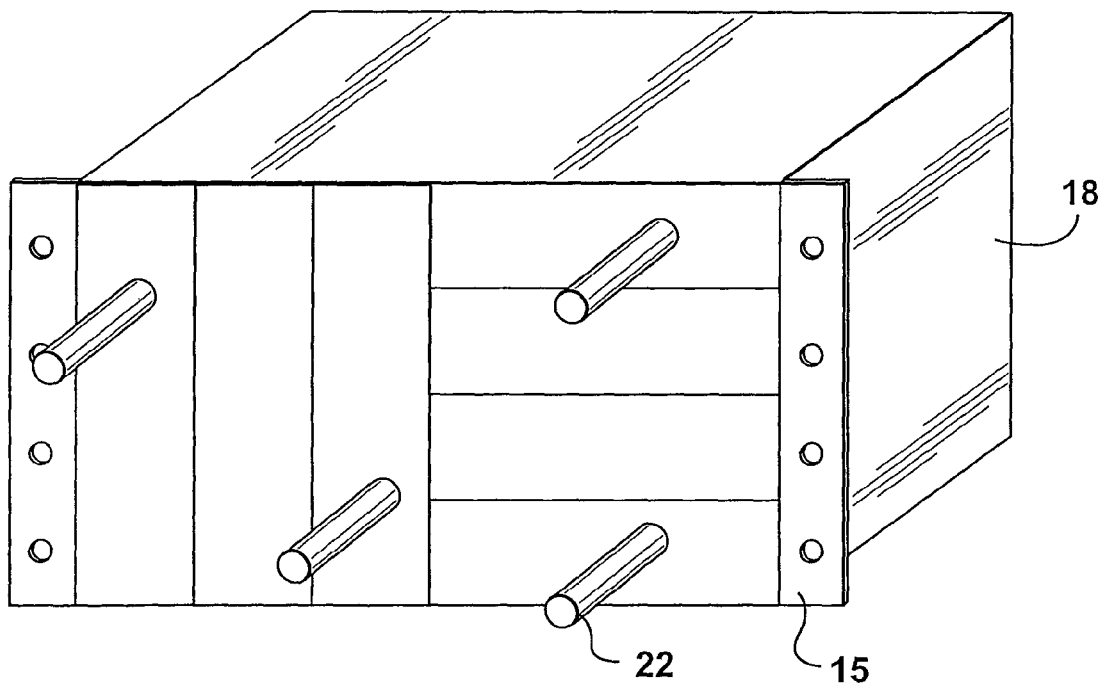
FIG. 7d illustrates circuit packs mounted horizontally and vertically within a card cage for placement in the cabinet.
Figure 7E:
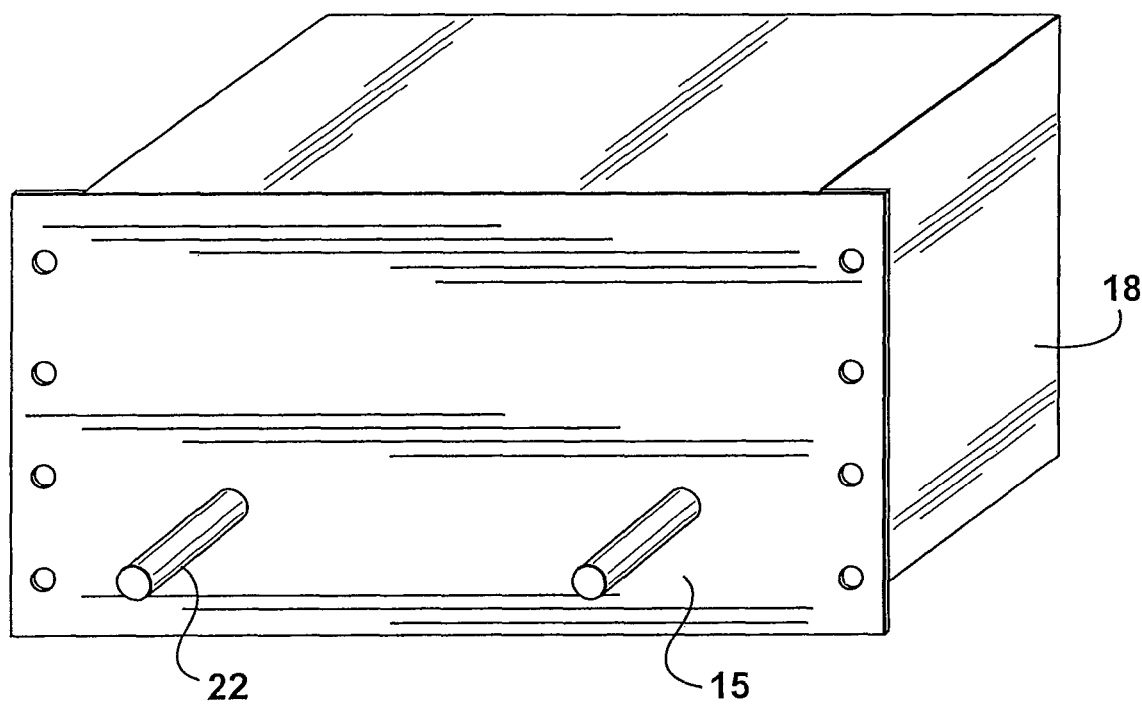
FIG. 7e illustrates a card cage with integral non-removable circuit packs for placement in the cabinet.

The function of the cabinet (10) is generally to house the various communication equipment contained therein. The communication equipment, as illustrated in FIG. 1, is generally contained in a series of circuit pack modules (14). The circuit pack modules or circuit packs (14) are generally arranged by plugging into a card cage such as the card cage (16) illustrated in FIG. 7a. The card cages (18) are then mounted to the racks (not shown) to present the assembled cabinet as best shown in FIG. 1. FIGS. 7a and 7b illustrate features of representative embodiments of a card cage (18). FIG. 7b in particular illustrates how the circuit pack modules (14) or circuit packs (14) are slid in between the guides (9). It should be understood that the circuit pack modules (14) are meant to be illustrative of a number of types of electronic components or equipment commonly deployed in rack mount equipment. Finally, it should be understood that rack mount equipment can be either directly mounted within a rack or installed on a shelf that is rack mounted.

For the sake of clarity, it should be understood that "rack mount equipment", "rack and stack equipment" and "card cages loaded with circuit packs", or variations of the foregoing, are synonymous.

It should also be understood that a number of different arrangements of such components are possible within the cabinet (10) that are common in the cabinets (10) described herein such as: horizontally installed circuit packs (14); just one circuit pack (14) per card cage (18) (horizontal or vertical mount); a combination of horizontal and vertically installed circuit packs (14); or rack mount equipment with non-removable circuit packs (14). These particular aspects of the invention are best understood by reference to FIGS. 7a, 7b, 7c, 7d and 7e.

It should be understood, that a number of different possible arrangements of the RF/microwave chamber (12) within the cabinet (10) are possible, including the specific embodiments described below. In each case the RF/microwave chamber (12) preferably: (A) is operable to shield from outside RF/microwave interference; and (B) is further operable to substantially absorb interior incident electromagnetic energy in an intended frequency range of operation (as further particularized below). Also, the RF/microwave chamber is preferably (C) operable to either selectively on non-selectively reflect internal signals to: i) direct electromagnetic signals around an obstruction, ii) enhance the RF/microwave chamber communication capacity due to increased spatial multiplexing when directional radiating units are deployed, and iii) reduce a three dimensional RF/microwave chamber to an planar or linear RF/microwave chamber, iv) to function as a waveguide. As a result of (B), multi-path signal distortion is reduced. Again, as particularized in the specific embodiments of the cabinet (10) described below, the interior of the RF/microwave chamber (12) uses a combination of reflective and absorptive surfaces (each such surface also referred to in this disclosure as a "facet" including the various reflective facets (13), or absorptive facets (30), as explained below and illustrated in the various Figs.) to achieve increased intra-cabinet communication capacity and reduce multi-path signal distortion resulting from such intra-cabinet wireless communication. As further particularized below, these reflective facets are designed to direct the signal in a manner to effect communication among radiating units (22) inserted within the RF/microwave chamber (12), as explained in greater detail below.

As stated earlier, ideally, the interior facets (e.g. any combination of absorptive and reflective facets) are oriented to form an enclosure which confines all electromagnetic energy generated therein, and furthermore, isolates all external electromagnetic energy from penetrating the RF/microwave chamber's interior. This enclosure could form part of the RF/microwave chamber, or could be a separate element. Optimal absorptive or reflective facet materials would not necessitate a separate enclosure, however, perfect absorptive or reflective facet materials do not exist and therefore additional measures may therefore be taken to further confine internal signals and isolate external signals. One such measure is to deploy an external RF shield that is constructed from an electrically conductive material and that completely envelops the enclosure. The RF/microwave chamber as disclosed herein generally assumes a two layer construction with an outer RF enclosure or shield (such as shield (11) described below) and an interior which is lined with materials which have different reflective and absorptive properties. In those cases where high quality facet material is deployed, the RF shield may not be required. Finally, it should be understood that the "facets" described in this disclosure are not necessarily flat surfaces but may in fact have curvature.

The combinations of inside facets that are either reflective or absorptive are chosen so as to optimize intercommunication among all transceivers (explained below) associated with the RF/microwave chamber (12) (particularized below) while substantially mitigating multi-path signal distortion. Optionally, inside facets of the RF/microwave chamber (12) can be lined or otherwise constructed from either a known frequency selective or a known non-selective material that will either reflect or absorb certain frequency components (as further explained below). The frequency selectivity and absorption/reflection properties of such material may or may not be electronically and dynamically controllable. In general, this feature allows greater flexibility in routing electromagnetic signals coincident in time, frequency, and space among radiating units within the RF/microwave chamber (12). For example, the ability to program one facet as a reflector for one TDMA channel, and as an absorber for the next TDMA channel facilitates more options in routing a signal around an unintentional receiver or other impairment (e.g. passage duct).

Another feature of the RF/microwave chamber (12) of the present invention is that the dimensions of the RF/microwave chamber (12) are optimized to promote signal propagation inside the RF/microwave chamber (12). Specifically, this is achieved by optimizing the chamber dimensions such that at least one dimension is greater than or substantially equal to ½ the wavelength (lambda/2) of the lowest frequency component of any signal to be transmitted within the RF/microwave chamber (12). Because the RF/microwave chamber (12) can have various different dimensions in its various implementations, it is useful to understand this rule as defining average dimension requirements. More particularly, the dimensions of the RF/microwave chamber are preferably such that the minimum cross-sectional dimensions perpendicular to and averaged over each possible signal trajectory within the RF/microwave chamber are greater than or substantially equal to lambda/2. By "substantially equal to" what is meant is that to facilitate signal propagation within the RF/microwave chamber (12) as contemplated by the present invention these dimensions are preferably not significantly less than lambda/2. In particular, it has been found that in most implementations if said average dimensions are fifteen percent (15%) less than lambda/2, then the operability of the RF/microwave chamber (12) as disclosed herein is significantly reduced.

Figure 9A:
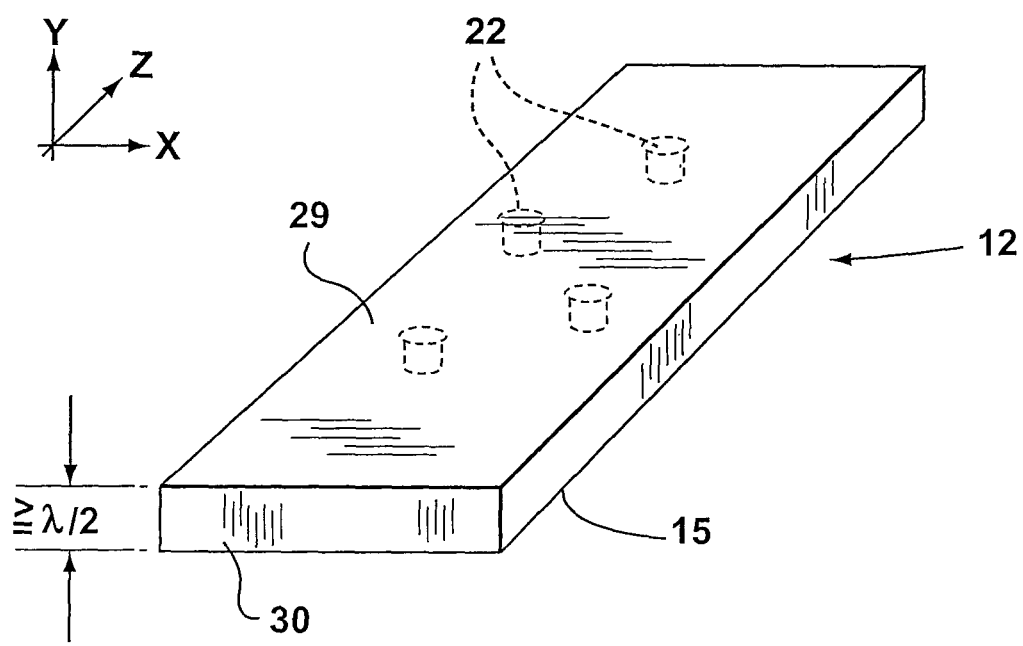
FIG. 9a is a representative view of a planar RF/microwave chamber in perspective, formed from two proximate parallel plates of the present invention.

It should be understood that the described dimensions of the RF/microwave chamber (12) are preferably a feature of the different embodiments of the RF/microwave chamber (12) described below. This particular aspect of the invention is illustrated in relation to particular embodiments of the RF/microwave chamber (12) described below, and as illustrated in FIG. 9a in particular. As a general example, signal frequencies propagated within the RF/microwave chamber (12) in accordance with the present invention are generally in the microwave range above 1 GHz. In free space, signal wavelengths of frequencies above 1 GHz are less than 30 cm. Therefore, the corresponding minimum dimension of the RF/microwave chamber (12) for efficient transmission is around 15 cm or greater. Lower frequencies are possible but necessitate the use of higher volume chambers with corresponding increases in cabinet costs. Additionally, at higher frequencies, for a given performance level, absorptive and reflective construction materials are volumetrically smaller and tend therefore to be less costly.

Another aspect of the various embodiments of the cabinet (10) in accordance with the present invention is that the RF/microwave chamber (12) includes two or more radiating units (22). Each radiating unit (22) is linked to an RF/microwave transceiver or transceiver (24). In a particular embodiment of the present invention the radiating units (22) and RF/microwave transceivers (24) are coupled so as to form a wireless intra-cabinet communication unit (ICCU) (26) or wireless multi-link device. It should be understood that the ICCU (26) can also be provided as a single integral unit, which is the preferred embodiment in the case of the MIMO ICCUs (26) described below. Further details of particular embodiments of the transceiver (24) are particularized below under the heading "Transceiver". Further details regarding possible structural implementations of the radiating units (22) are as explained below.

A radiating unit (22) is best understood as a structure made from conductive and/or dielectric materials, the structure having been designed to have a shape and size such that it will transmit or receive radiated electromagnetic power in an efficient manner. The radiating unit (22) may be a simple fixed structure such as an omni-directional dipole, or it may be comprised of one or more switched or phased array antenna or radiating elements capable of spatially forming a beam. The formed beam may be electrically and dynamically controllable. Further details regarding different types of radiating units (22) are included below.

Regarding the ICCU (26), it should be understood that a number of different embodiments are contemplated by the present invention, a number of examples of which are described. First, the ICCU (26) can be provided as a through hole unit as in FIG. 6a, or as a standard surface mount unit (with pads rather than the pins illustrated on the underside in FIG. 6a). Second, the transceiver (24) can be remotely connected to the radiating unit of the ICCU (26) via controlled impedance interconnect(s) (e.g. coax, stripline, PCB microstrip, etc.). The radiating element(s) that comprise the radiating unit of the ICCU (26) can be any known antenna type(s). The transceiver (24) design (components and their interconnect) can be realized directly on the circuit pack PCB to which the component illustrated in FIG. 6a might otherwise be mounted.

Figure 6A:
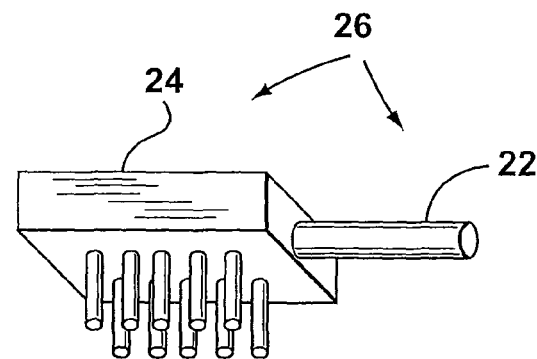
FIG. 6a illustrates the intra-cabinet communication unit of the present invention, in a perspective view thereof.
Figure 6B:
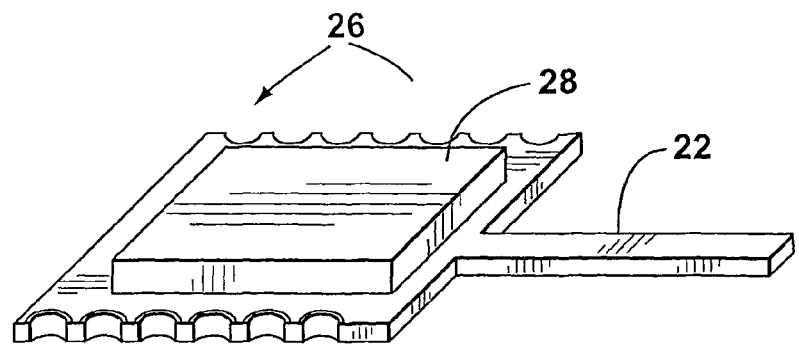
FIG. 6b illustrates a transceiver module in a surface mount SOP with optional integrated radiating unit.
Figure 6C:
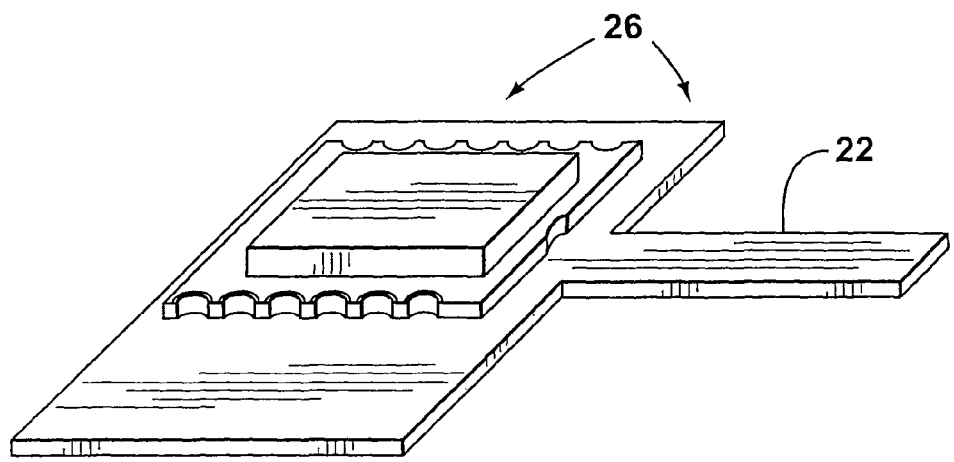
FIG. 6c illustrates a standalone transceiver module in a surface mount SOP mounted on a circuit pack with the radiating unit formed therein.

FIG. 6b illustrates a particular embodiment of the ICCU (26), consisting of a surface mount System-On-Package (SOP) or SOP module (28). Although the SOP module (28) is shown as a "surface mount" PCB component it should be understood that a "through hole" type structure could also be used, as will readily apparent to those skilled in the art. In FIG. 6c, the RF/microwave transceiver (ICWT) (26) preferably is provided in conformity with known standards for electronic components, thereby promoting their widespread use and ready deployment within a large number of cabinets (10). FIG. 6a illustrates a single element omni-directional monopole, as a particular embodiment of the radiating unit (22), however, it should be understood that the radiating unit (22) may be comprised of one or more radiating elements to effect omni-directional, statically directional or dynamically directional transmission and receipt of radiated electromagnetic signals. As explained below, it should also be understood that the present invention contemplates that the ICCU (26) will-include a steerable, multi-directional antenna. The signal frequencies propagated may fall, for example, within the UWB regulations of the Federal Communications Commission of the United States ("FCC") or other similar bodies in other jurisdictions. Signals designed to comply with UWB regulations generally benefit from higher permissible ambient transmit powers. Other signal frequencies (preferably above 1 Ghz) and associated standards are possible including IEEE 802.11 WiFi, IEEE 802.15 PAN, IEEE 802.16 WiMax, and Bluetooth.

Optionally, the radiating unit (22) may be constructed from PCB materials. Specifically, the radiating unit (22) can be manufactured using the same materials and processes used to make printed circuit boards in general and in a particular representative embodiment of the present invention, the transceiver (24) is extended to include the radiating unit (22), for example, by providing an etched section on a section of PCB substrate that extends beyond the nominal board outline for insertion into the RF/microwave chamber (12) that provides the function of the radiating unit.

Figure 8:
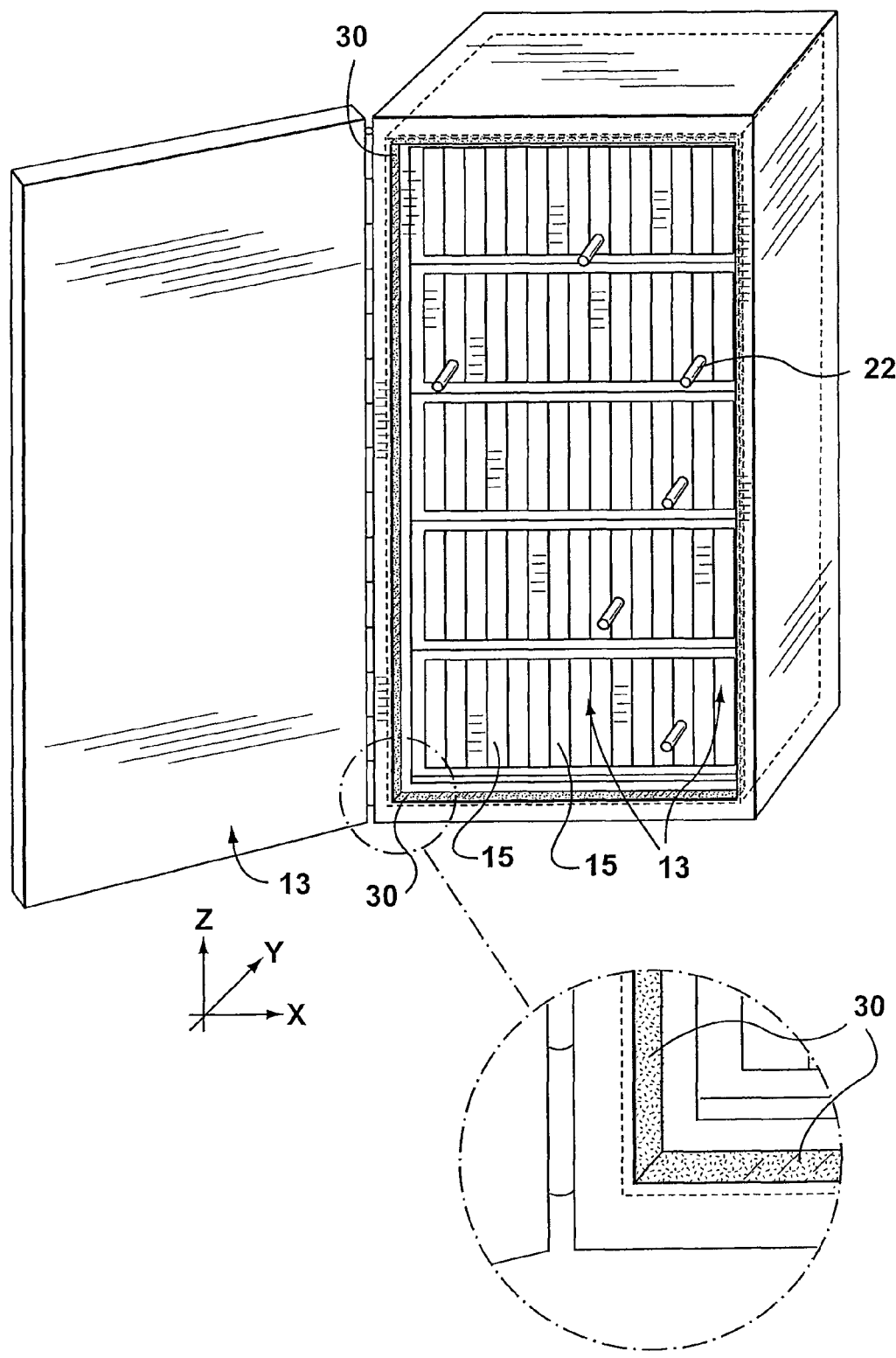
FIG. 8 is a further perspective view of a cabinet for broadband wireless components, that includes a representative arrangement of the RF/microwave chamber of the present invention.
Figure 11:
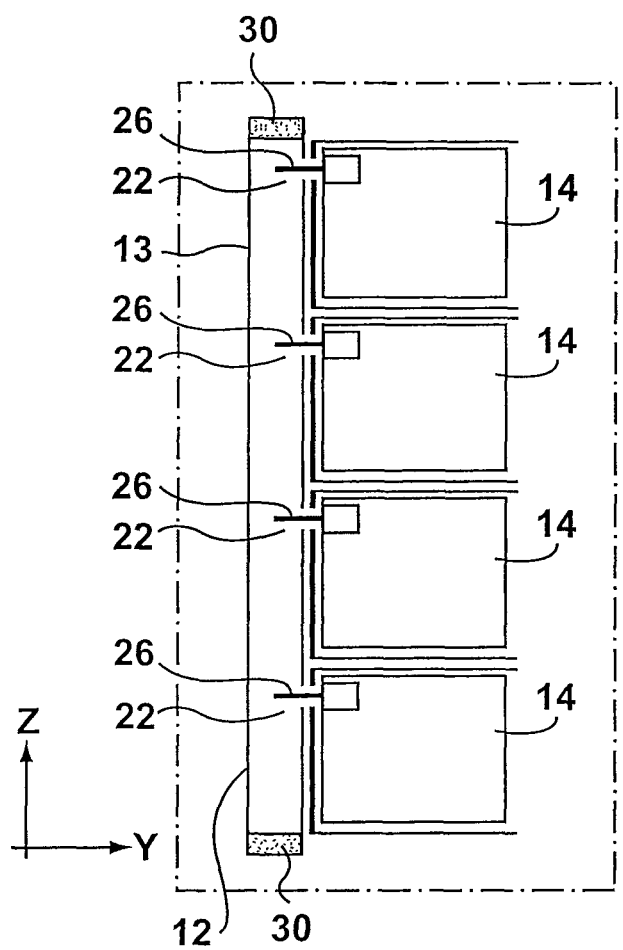
FIG. 11 is a cross-sectional view of the RF/microwave chamber of the present invention mounted in the back plane of the cabinet.

The radiating units (22) (or radiating unit portions) are located on the interior of the RF/microwave chamber (12), as for example shown in FIGS. 8 and 11. FIG. 8 in particular illustrates that a unitary rack structure that includes a series of card cages (18) disposed within the cabinet (10). The transceiver (24) (or transceiver portion) is typically located exterior to the RF/microwave chamber (12), as for example illustrated in the embodiment shown in FIG. 11. However, it should be understood that the transceiver (24) can also be disposed inside the RF/microwave chamber (12).

Each ICCU (26) is operable to transmit and receive RF/microwave signals internal to the RF/microwave chamber (12).

Each radiating unit (22) includes either single or multiple radiating elements suitable for interconnection to a single-input-single-output (SISO) or to a multiple-input-multiple-output (MIMO) transceiver respectively, depending on the particular intra-cabinet communication requirements. For example, SISO radiating units (22) have only one radiating element in the radiating unit (22) and are therefore not electrically steerable. They are, however, less costly to produce (single element radiator means the electronics in the transceiver only need to interface to one radiating element). SISO radiating units (22) can be directional or omni-directional. In general, it is possible to increase communication capacity of the RF/microwave chamber (12) (i.e. potential for the RF/microwave chamber (12) to yield higher aggregate bandwidth) by employing spatial multiplexing. Spatial multiplexing is a known technique that permits two independent communication links to exist in the same time, frequency, code, and polarization domains provided that they are adequately separated in space such that the effect of mutual interference is marginal. For example, 10base2 cables, due to their shielding (i.e. radiation containment), can be placed in close proximity to one another with minimum mutual interference. By analogy, directing the radiation energy transmitted from one radiating unit (22) and received by a second radiating unit (22) permits a second similarly configured pair to be placed in closer proximity, hence spatial multiplexing. Static directional radiating units (22) are useful to effect an increase in the communication capacity of a system when the SISO radiating units (22) are used in a point-to-point link in fixed space. They are less useful under multipoint-to-multipoint communication conditions where the receiving radiating unit (22) needs to receive information from many different and spatially diverse time division multiplexed transmit radiating units (22) and likewise, the transmit radiating unit (22) needs to transmit time division multiplexed information to different spatially diverse receive radiating units (22) at different times.

A MIMO implementation employs multiple radiating elements within a radiating unit (22) to facilitate dynamic directivity (i.e. it can be electrically steered and hence its direction can be programmed/changed over time). The transceiver circuitry needed to support (i.e. steer) the dynamic radiating unit (22) is more complex and costly, but is well known to those skilled in the art. Both SISO and MIMO implementations can yield higher RF/microwave chamber (12) communication capacity by employing directional radiating elements to facilitate spatial multiplexing. MIMO radiating units (22), however, have a distinct advantage over SISO radiating units (22): since their directivity can be changed over time, they are capable of spatially multiplexing multipoint-to-multipoint communication links, as particularized below.

The MIMO radiating units (22) can also, employ different electric field polarizations to effect increased RF/microwave chamber (12) communication capacity through polarization division multiplexing, also in a manner that is known. For example, the radiating unit may be constructed from two orthogonally opposed and independently fed radiating dipole elements whereby an interconnected MIMO transceiver would be operable to transmit and receive different and independent information on each of the two radiating elements.

The MIMO transceiver (24) is capable of electrically and dynamically focusing and steering the incoming and outgoing radiation pattern of the multiple-element radiating unit (22) for spatial multiplexing of signals within the RF/microwave chamber (12). The MIMO transceiver (24) is capable of electrically and dynamically setting the radiating unit (22) for polarization multiplexing of signals within the RF/microwave chamber (12).

It should be understood that each of the different embodiments of the RF/microwave chamber (12) discussed below, including the front plane embodiment, the back plane embodiment, the mid plane embodiment, and combinations of the foregoing, can be presented using said SISO omni-directional radiating units (22), said MIMO dynamically steerable radiating units (22), or both.

Figure 5A:
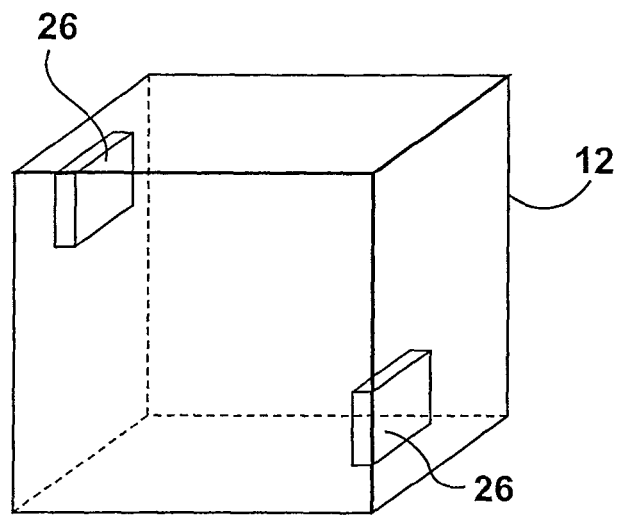
FIG. 5a illustrates a particular embodiment of the RF/microwave chamber, which is a six-sided chamber that includes an outer conductive shield and an inner lining of frequency absorption material.
Figure 5B:
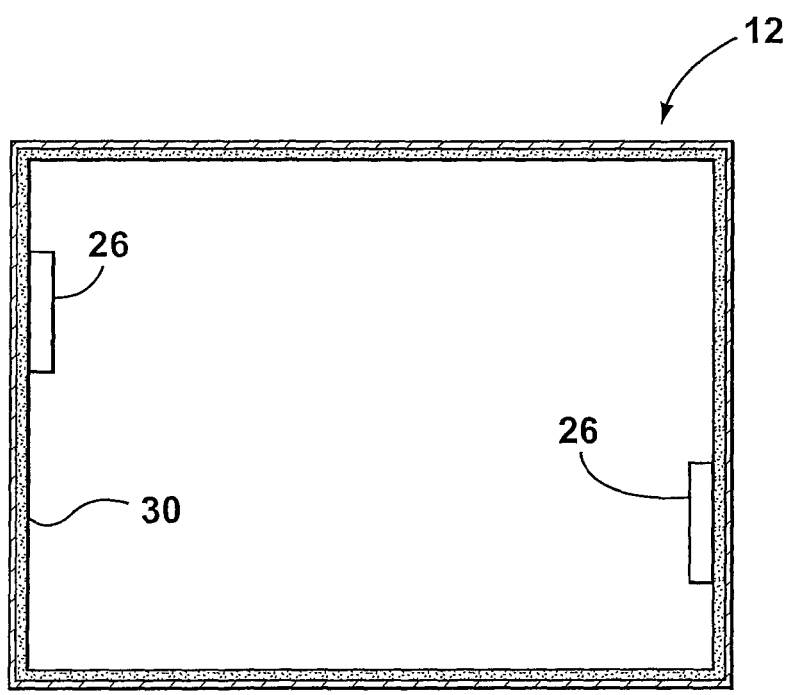

In a very particular embodiment of the present invention, the shielded environment of the RF/microwave chamber (12) includes a lining (20) constructed from a RF/microwave spectral absorption material that significantly attenuates reflections of internally radiated signals as best illustrated in FIG. 5b. An example of a suitable spectral absorption material is: ECCOSORB LS-26 from EMERSON™ and CUMING MICROWAVE PRODUCTS™. In one particular embodiment of the present invention, the RF/microwave chamber (12) resembles that of an anechoic chamber as illustrated in FIG. 5a. In this particular embodiment, a six-sided RF/microwave chamber (12) in which each side is an absorptive facet (30), and which further includes an outer reflective shield (11) and an inner lining (20) of absorptive material (which is a particular form of an absorptive facet (30) as particularized in this disclosure). Two radiating units (22), in this simple construction, are disposed inside the RF/microwave chamber (12) with a clear path for communication therebetween.

It should be understood that the RF/microwave chamber (12) disclosed has a rectangular shape, however, other three-dimensional shapes are possible so long as there is an external shield, RF/microwave absorption facets, and two or more radiating units (22).

Also, it should be understood that the present invention also contemplates particular embodiments of the reflective facets (13) that accommodate different parameters affecting communication between ICCUs (26), such as for example differences in the shape of the RF/microwave chamber (12) that inhibit a clear path between two or more ICCUs (26). FIGS. 5a and 5b illustrate a representative embodiment of the RF/microwave chamber (12) (the shape thereof is representative only) in which line-of-sight is possible among all installed radiating units (22).

Figure 9B:
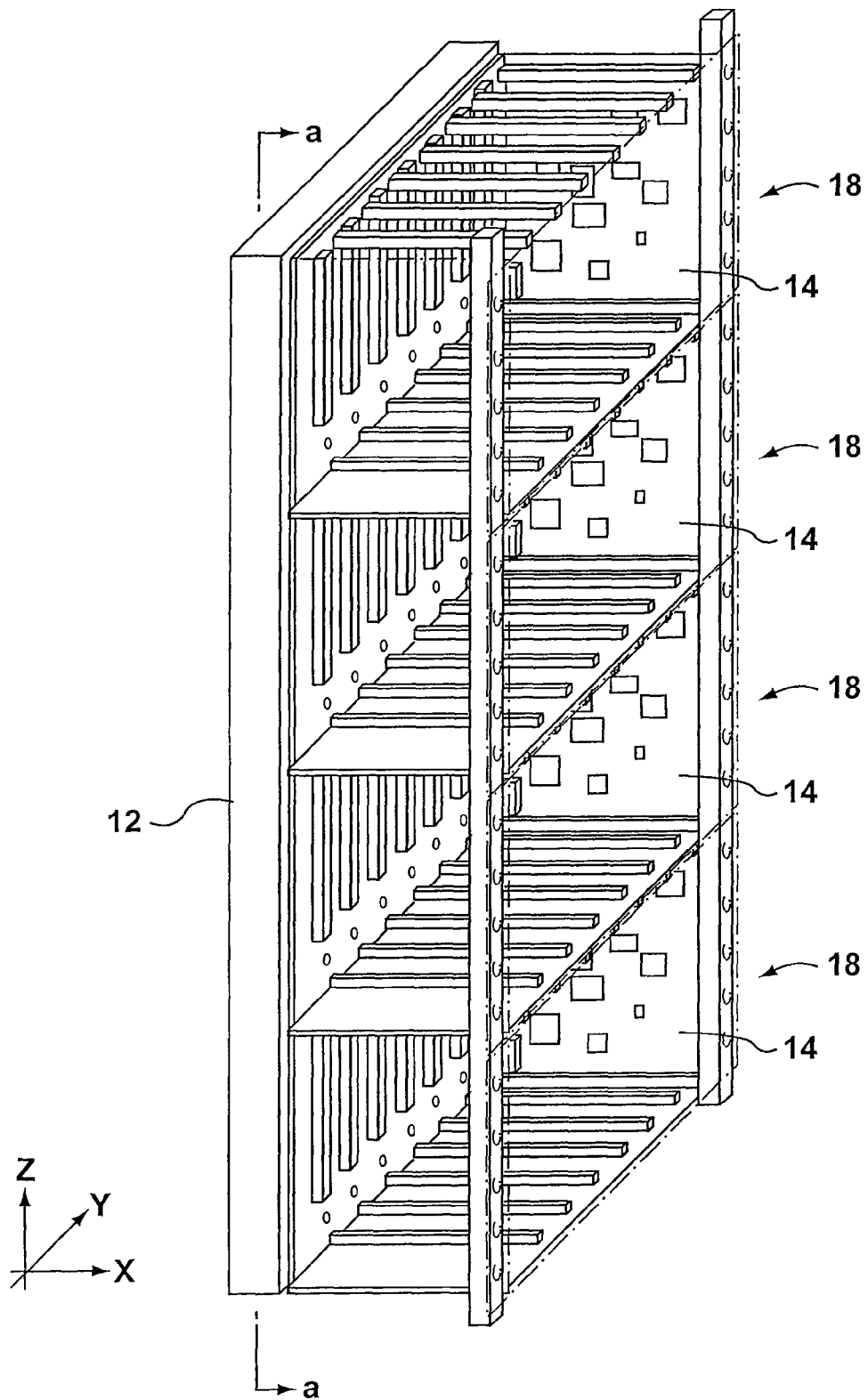
FIG. 9b illustrates the spatial relationship between the RF/microwave chamber and a card cage, in this case in connection with a back plane embodiment thereof.
Figure 10A:
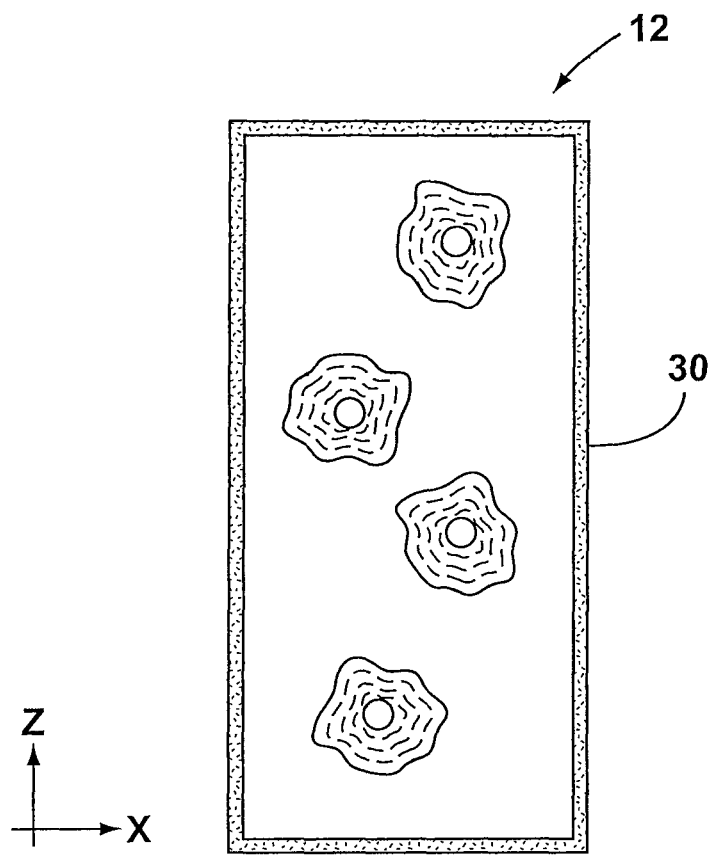
FIG. 10a is a cross-sectional view of the planar RF/microwave chamber illustrated in FIG. 9b, the cross-section being taken along line a-a shown in FIG. 9b, illustrating the use of absorptive perimeter facets and omni-directional SISO radiating units.

It should be understood that each of the particular embodiments of the RF/microwave chamber (12) shown in FIGS. 10a to 10e and illustrate particular uses of absorptive and reflective facets consists of a cross-sectional view of the RF/microwave chamber (12), such as the cross-section shown in FIG. 10a taken on FIG. 9b.

FIG. 10a illustrates a cross-sectional view of a planar RF/microwave chamber that employs SISO omni-directional radiating units and that is formed by two proximate parallel reflective facets spaced apart by at least half a wavelength of the lowest signal frequency. The parallel reflective facets serve to constrain energy in the Y direction for efficient propagation within a planar (i.e. two dimensional) XZ space. In this embodiment the RF/microwave chamber (12) can be viewed as a two dimensional waveguide, but one in which all remaining facets employ absorptive material to "terminate" incident electromagnetic energy at its periphery.

Figure 10B:
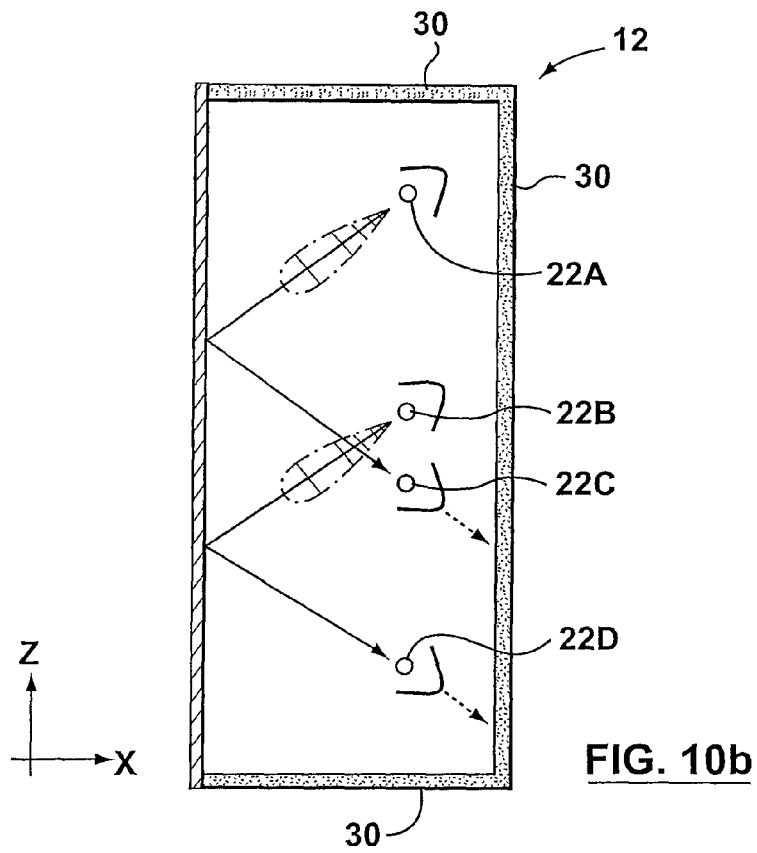
FIG. 10b is a cross-sectional view of the planar RF/microwave chamber illustrated in FIG. 9b, the cross-section being taken along lines a-a shown in FIG. 9b, illustrating the use of reflective and absorptive perimeter facets, and directional radiating units.

FIG. 10b illustrates the use of a reflective facet (13) in conjunction with electrically steerable MIMO directional radiating units to enable improved access of all ICCUs (26), in a particular planar embodiment of the RF/microwave chamber (12).

Figure 10C:
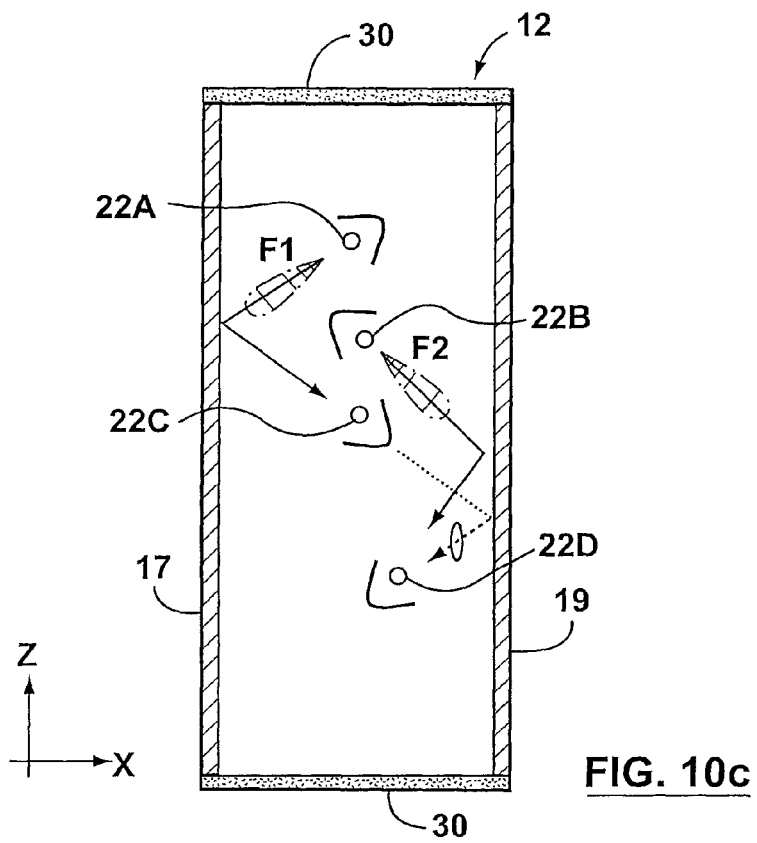
FIG. 10c is a further cross-sectional view of the planar RF/microwave chamber, in which the use of frequency selective material as the reflective facets is illustrated.

FIG. 10c illustrates the use of frequency selective surface facets (13) in conjunction with electrically steerable MIMO directional radiating units to enable improved access of all ICCUs (26), in a particular planar embodiment of the RF/microwave chamber (12).

Figure 10D:
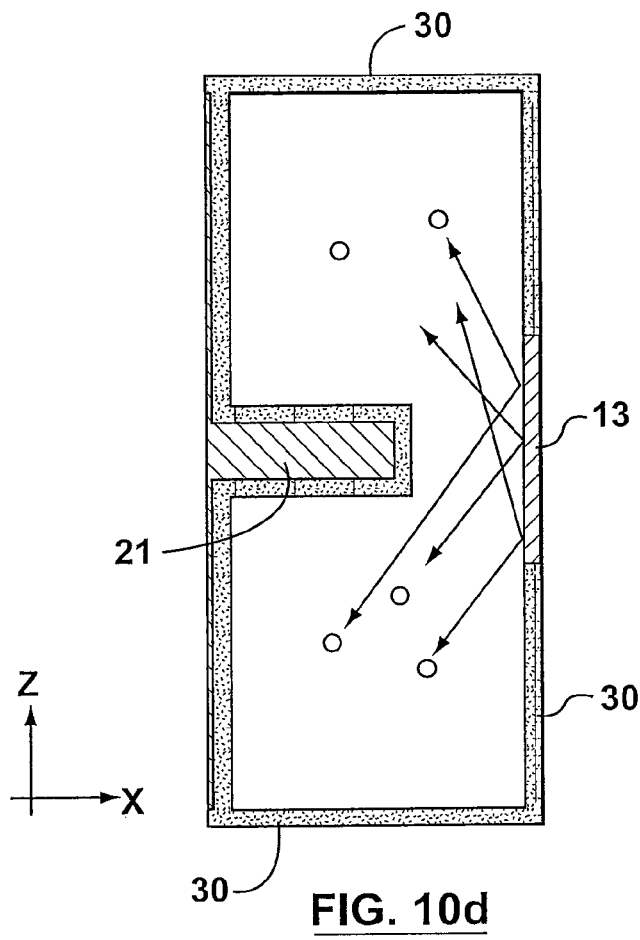
FIG. 10d is a further cross-sectional view of the planar RF/microwave chamber, in which a reflector is used to direct electromagnetic energy within a non-convex RF/microwave chamber.

Alternatively, FIG. 10d illustrates a non-convex planar RF/microwave chamber (12) in which line-of-sight is not possible among all radiating units (22). In this case, a reflective facet (13) is strategically placed to allow access among all transceivers (24) either by reflection or by line-of-sight while minimizing multipath distortion that manifests from reflected signals.

Figure 10E:
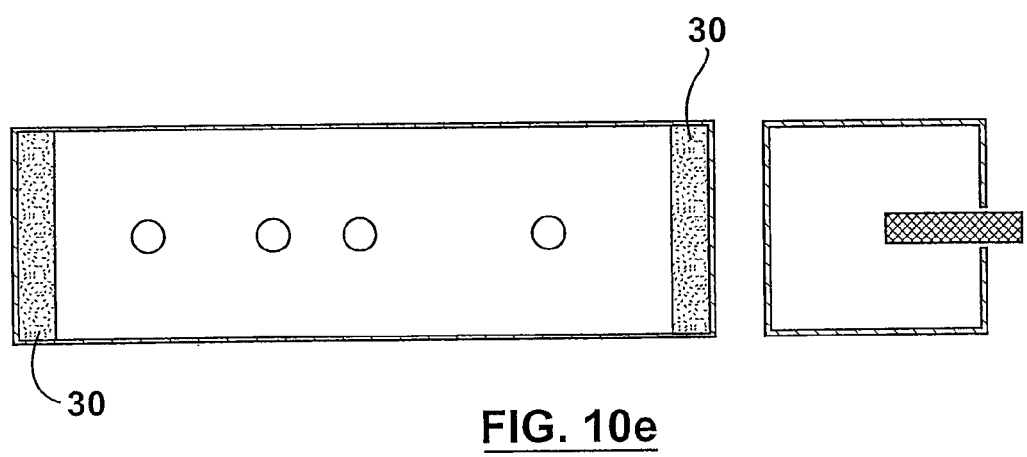
FIG. 10e is an end cross-sectional view of a linear RF/microwave chamber constructed from two orthogonal sets of proximate conductive parallel plates.

FIG. 10e illustrates a linear RF/microwave chamber formed from two orthogonal sets of proximate parallel plates spaced apart a least ½ wavelength of the lowest signal frequency. The two remaining end facets are terminated with absorptive material and electromagnetic energy is constrained to a line. In this embodiment the RF/microwave chamber (12) can be viewed as a one dimensional waveguide, but one in which all remaining facets employ absorptive material to "terminate" incident electromagnetic energy at either end.

It should be understood that the present invention also contemplates the strategic placement of reflective facets (13) to increase communication capacity, as illustrated for example in FIG. 10b.

It should also be understood that the present invention contemplates the use of different types of radiating units (22) as described above (i.e. SISO, MIMO) and also facet materials (i.e. electrically controllable FSS, and electrically controllable materials that can be switched between reflective and absorptive states, which materials are known) so as to modulate the communication capacity of the RF/microwave chamber (12) as described.

Particular embodiments of the cabinet (10) of the present invention, including the RF/microwave chamber (12) particularized herein are described below, namely the "Front plane Embodiment", the "Mid plane Embodiment, and the "Back plane Embodiment". For the sake of understanding, the "Front plane" refers to the front of the cabinet (10) adjacent to the door (30) shown in FIG. 1. The "mid plane" and "back plane" refer to planes of the cabinet (10) set back from the front plane, distal to the door (30).

Front Plane Embodiment

The front plane embodiment is best understood by reference to FIG. 8. In this embodiment, wireless transmissions for intra-cabinet communication are made in the front of the cabinet (10) where rack and stack equipment, including the racks (not shown) and card cages (18) are generally aligned within the same vertical plane. The card cages (18) are disposed within the racks and are best understood by reference to FIG. 7b. The circuit pack modules (14) installed within the card cages (16) can be readily moved/added/changed through the front of the cabinet (10) without the need to disconnect interfering cabling, by operation of the present invention.

Figure 3:
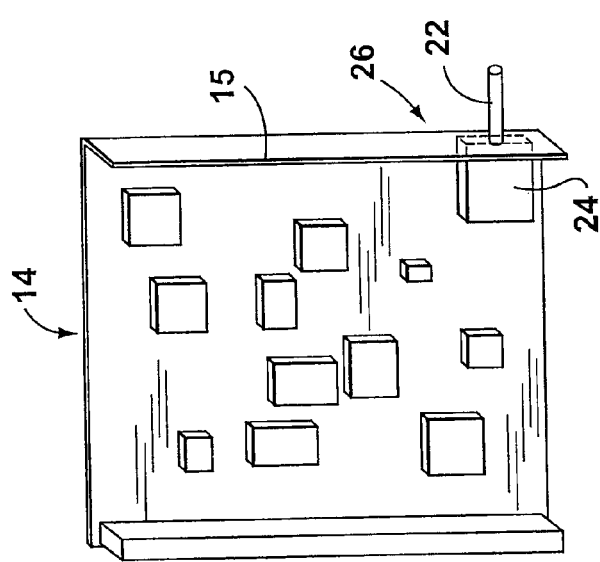
FIG. 3 is a perspective view of a representative circuit pack module.

The ICCU (26) described above is preferably mounted to the circuit pack modules (14), as best illustrated in FIG. 3. The circuit pack modules are subsequently installed in card cages or other rack mount equipment as shown in FIGS. 7b-7e. In a particular aspect of this embodiment of the present invention, each circuit pack module (14) or rack mount equipment includes an integral electrically conductive faceplate (15), as shown in FIG. 3. Out-of-cabinet interconnects and power cables are preferably routed at the rear of the cabinet (10) (not shown).

In accordance with the front plane embodiment, the electrically conductive faceplates (15), provide one of the reflective facets of the RF/microwave chamber (12). The electrically conductive cabinet door (29) forms a second proximate parallel reflective facet of the RF/microwave chamber (12) and is spaced at least ½ wavelength (of the lowest spectral signal component) apart from the faceplate facet (15). In this front plane embodiment, the two parallel conductive facets (i.e. faceplate facet (15) and the cabinet door (30)) constrain RF propagation to the ZX plane so as to form a planar RF/microwave chamber as best illustrated in FIG. 9a. The gap between each faceplate is preferably RF shielded (in a manner that is known) to ensure isolation between unintentional circuit pack radiation and intentional RF/microwave chamber (12) radiation. In FIG. 9a, the top facet is provided by the door (29) illustrated in FIG. 8, the bottom facet is provided by the various RF shield face plates (15), and the radiating units (12) are internal to the rectangular planar RF/microwave chamber (12) illustrated in FIG. 9a.

For omni-directional SISO radiating units (22), the four remaining facets of the RF/microwave chamber (12) are formed from RF absorption material, as illustrated for example in FIG. 10a, which RF absorption material is designed to reduce the magnitude and duration of the RF/microwave chamber's (12) impulse response, and thereby provide the absorptive facets (30) as shown in FIG. 9*a*. By analogy, this is the equivalent to terminating the end of a transmission cable with a matching impedance to eliminate reflection. With reference to FIG. 10*a* the signal emanating from the applicable radiating unit (22) is linearly polarized in the "Y" direction and propagates radially outward with equal power in the "XZ" plane. On contact, the signal is substantially absorbed by the RF absorption material installed along the inside periphery of the cabinet (10).

In this embodiment, the cabinet walls which support the peripheral absorption facets are preferably constructed from a conductive material to function as a shield to external RE interference. The conductive faceplates and front cabinet door reflective facets also serve as an RF shield in this particular embodiment of the invention: the cabinet walls, door, and circuit pack faceplates therefore collectively comprise an external RF shield which completely envelops the planar RF/microwave chamber (12).

For electrically and dynamically steerable MIMO radiating units (22), the four remaining facets of the planar RF/microwave chamber (12) may be constructed from both reflective and absorptive material as explained below. Under these circumstances, the introduction of an intentional reflector increases the number of routing options for spatial multiplexing without compromising multipath distortion, as illustrated in FIG. 10*b*. In FIG. 10*b*, radiating units (22) are labeled from top to bottom as (A), (B), (C), and (D) respectively. The rays shown in FIG. 10*b* are meant to illustrate an ephemeral electromagnetic transmission between (22A), (22B), (22C) and (22D) scheduled to occur coincident in time. If the radiating units (22) were omni-directional, and assuming equal transmit powers, (22C) would receive higher signal strength from the unintentional signal source (22B) than the intentional signal source (22A). Under these circumstances (22C) receipt of a signal from (22A) is not possible. Boosting (22A) power (and therefore signal strength to (22A)) with respect to (22B) can help overcome this problem but generally creates a problem for (22D) in receiving signal from (22B). Generally speaking the use of known directional radiating units (22) can help mitigate this problem. If (22A), (22B), (22C), and (22D) are capable of forming narrow beam widths that are dynamically steerable, then the likelihood of unintentional receipt of electromagnetic signals can be reduced. FIG. 10*b* illustrates a particularly challenging situation in that the receiver of (22C) is directly in the line-of-sight (LOS) path between (22B) and (22D). In this case, (22C)'s unintentional receipt of signal from (22B) can be mitigated by directing (22C) transmission "around" (22C) to (22D) (think of a bank shot on a pool table). This is accomplished by steering (22B) to bounce off of a reflective facet within the RF/microwave chamber (12) and steering (i.e. beam forming) (22D) to have higher directivity in the direction of the signal emanating from the reflective surface facet (13) illustrated in previous Figs. Finally, the absorptive facets (30) absorb incident energy that is not absorbed by the radiating unit (22) receiving a signal (or "receive radiating units or units) so that it cannot otherwise reflect and subsequently interfere with other receive radiating units (22).

It should be understood that different facets can be constructed from frequency selective material that have different frequency dependent absorption/reflection characteristics as explained below. Absorptive or reflective materials that have this characteristic are known. This is useful in frequency division multiplexed systems where, for example, a reflective surface acts as a reflector for one frequency channel and as an absorber for another. In accordance with one particular aspect of the present invention, the communication capacity of the RF/microwave chamber (12) described herein is increased by leveraging the different options that are available within the described RF/microwave chamber (12) to route radiated electromagnetic signals that are coincident in time and adjacent in frequency.

With reference to the FIG. 10*c* below, radiating units (22A) and (22C) transmit and receive at frequency F1 respectively, and radiating units (22B) and (22D) transmit and receive at frequency F2 respectively. A first frequency selective surface (17) or FSS1 substantially reflects electromagnetic energy in the F1 frequency range and absorbs all others. A second frequency selective surface (19) or FSS2 substantially reflects electromagnetic energy in the F2 frequency range and absorbs all others. In this example simultaneous direct line of site communication is undesirable since radiating unit (22C) would receive more unintentional F2 signal strength from (22B) than intentional F1 signal strength from (22A). This could cause a problem if F1 and F2 are adjacent frequencies and the selectivity (i.e. immunity to adjacent channel interference) of the radiating unit (22C) is low to moderate. Indirect routing of signals via a frequency independent reflective surface or facet is also undesirable. This is because if FSS2, for example, were a frequency independent reflective facet and FSS1 were an absorptive facet, then a significant portion of F1 would be undesirably received by radiating unit (22D) via the reflective facet. This again could cause a problem if F1 and F2 are adjacent frequencies and the selectivity (i.e. immunity to adjacent channel interference) of the applicable ICCU is low to moderate. In this example the use of the frequency selective surface reflector (FSS2) mitigates this problem. FSS2 reflects F2 but absorbs F1 so that F1 cannot interfere with (22D)'s receipt of (22B)'s signal. Likewise, FSS1 reflects F1 but absorbs F2 so that F2 cannot interfere with (22C)'s receipt of (22A)'s signal.

For multipoint-to-multipoint communication, these radiating units (22) may operate in time division multiplex and time division duplex modes, as is known to those skilled in the art. Ideally, their directivity is changeable in "real time" for each time division channel. By "real time" we mean that the directivity of a continuously transmitting or receiving radiating unit (22) can be switched such that, when compared to an omni-directional radiator, its overall throughput is not significantly impacted. Dynamic radiating units (22) that cannot be switched in real time can also be useful: in this case the scheduler or ICWT (described below) needs to be aware of the radiating units' switching response time so that it can schedule transmissions at a reduced duty cycle. Generally there are two kinds of known radiating units (22) which can electronically move (i.e. steer) the beam direction of the radiating unit (22): a switched beam radiating unit, and an adaptive phased array radiating unit. See, for example, U.S. Pat. No. 6,049,307 issued to Sarkar et al. that discloses "Smart Antenna" technology that would be suitable to provide a steerable radiating unit (22) as described herein.

It should also be understood that controllable/programmable facet material can also be utilized to provide additional flexibility in routing electromagnetic signals within the RF/microwave chamber (12). This type of material is well known in the art.

FIG. 10*d* illustrates a cross-sectional view of a non-convex planar RF/microwave chamber that uses reflective facets (13) for the purpose of promoting signal propagation in the RF/microwave chamber (12), even in the presence of an obstruction. It should be understood that the obstruction (21) illustrated in FIG. 10d is representative of various obstructions that can be imagined in providing the RF/microwave chamber (12) inside a cabinet (10).

It should be understood that FIGS. 10b and 10d show the absorptive perimeter facets, but not necessarily all of the absorptive facets used in certain embodiments of the invention described herein. It should also be understood that reflective facets perpendicular to the parallel plates can be added to permit non line of site or alternate propagation path for spatial multiplexing.

Back Plane Embodiment

As shown in the perspective of FIG. 9b and the cross-sectional view of FIG. 11, in the back plane embodiment of the present invention, the ICCUs (26) are installed at the rear of the circuit pack modules (14) with the various radiating units (22) protruding into a centrally located rectangular RF/microwave chamber (12) of at least ½ wavelength distance in the "Y" direction and extending from side to side and top to bottom of the cabinet in the "X" and "Z" dimensions respectively. It should be understood, that other than the manner in which the RF/microwave chamber in physically formed within the cabinet, all discussions of the front plane embodiment are equally applicable to the backplane embodiment.

Mid Plane Embodiment

Figure 12:
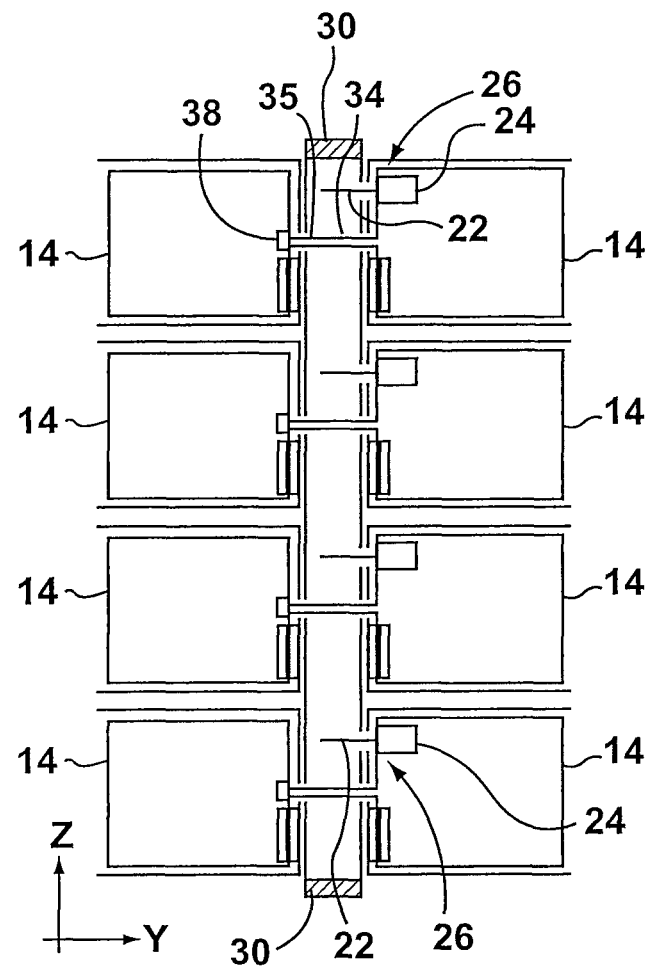
FIG. 12 is a cross-sectional view of the RF/microwave chamber of the present invention mounted mid plane of the cabinet, and the use of a passage duct.

The embodiment is considered mid plane if circuit pack modules (14) exist on either side of the RF/microwave chamber (12). This particular embodiment of the RF/microwave chamber (12) disclosed herein is illustrated in FIG. 12.

Known interfacial card cage PCB back planes may be present on either or both sides of the RF/microwave chamber (12) to facilitate power distribution among the various circuit pack modules (14) collocated in the racks (not shown) positioned on either side of the RF/microwave chamber (12) in the mid plane embodiment thereof.

For mid plane applications of the RF/microwave chamber (12), the chamber can be fitted with horizontal ducts (also referred to as an interconnect) (35) that permit the passage of signals (via electrical and optical cables, and connectors) from/to front mounted card cages and circuit pack modules contained therein to/from geometrically aligned rear mounted card cages and circuit packs contained therein. The cross-sectional area of the ducts (35) (in the XZ plane) is typically small in relation to the cross-sectional area of the RF/microwave chamber (12) so as to minimize multi-path signal distortion. For backplane applications the same ducts (35) may be utilized as a means to pass off-cabinet interconnect to/from front card cages (18) and circuit pack modules (14). For the passage of electrical signals, the duct material may be constructed from known electrically conductive material to provide shielding and/or RF absorptive material to reduce multi-path signal distortion due to reflection. The ducts (35) may be formed either entirely within the RF/microwave chamber (12), or in concert with the circuit pack module (14). FIG. 12 illustrates details of one representative duct (35) arrangement whereby the RF/microwave chamber (12) is fitted with two aligned rectangular slots (not shown) of dimensions less than ½ the wavelength of the highest spectral component of the RF signal. An interconnect (35) is shown between the front and back circuit packs (14), in one embodiment of which a small portion or protruding section (34) of the front circuit pack module (on the right side of FIG. 12) is extended to pass electrical signals through the RF/microwave chamber (12) and mate with an edge connector (38) installed on the aligned rear PCB circuit pack module (on the left side in FIG. 12). As is well known, the PCB forming the front circuit pack module (14) and the rear circuit pack module (14) is of a multilayer construction with signal traces in the protruding section (34) sandwiched between copper clad outer layers. Shielding of the protruding section (34) signals is completed by placing closely spaced vias along each edge so as to electrically connect top and bottom layers. An RF absorption material (not shown) can be applied to the front and back of the protruding section (34) of the PCB to reduce reflections within the RF/microwave chamber (12).

It should be understood that multiple RF/microwave chambers (12) can be deployed within the same cabinet (10), in fact, there can be as many RF/microwave chambers (12) as there are "independent" networks. For example, the RF/microwave chamber (12) illustrated in FIG. 11 could be sub-divided into two: one for the upper two card cages, and one for the lower two card cages. A problem may exist, however, if communication is required between say the top and bottom card cages. This can be alleviated by introducing an additional RF/microwave chamber (12) populated with ICCUs (26) that facilitate communication intended to span the sub-chambers. Alternatively, one could electrically connect two or more ICCUs together directly, where each RF/microwave chamber (12) requiring interconnection would have at least one ICCU (26) present for this purpose. In either case one could construct a hierarchical network of RF/microwave chambers (12) that would be useful to increase overall system communication capacity, as particularized in this disclosure. By analogy, LANs in a computer network are interconnected hierarchically via routers to confine local traffic within the LAN. In this manner, the bandwidth requirements for each LAN can be reduced since they need only process local traffic and traffic specifically routed to the LAN wherein a device is known to reside. In summary, each RF/microwave chamber (12) can be considered as a LAN, and information not confined to the RF/microwave chamber (12) can be routed to other chambers via ICCU(s) (26) allocated for that purpose.

A cabinet (10) might employ more than one RF/microwave chamber (12) for a number of reasons. These include, but are not limited to: 1.) the cabinet (10) has physical constraints which preclude the use of a single RF/microwave chamber (12), or 2.) the communication capacity of a singe RF/microwave chamber (12) cannot handle the system bandwidth requirements. In the first case, the cabinet (10) and the equipment installed therein might have other features that make it difficult to construct a single RF/microwave chamber (12) that can accommodate the inter-communication needs of all circuit pack modules (14) collocated within the cabinet (10). As an example, consider a modified mid-plane embodiment of FIG. 12 in which a much deeper fifth card cage is interposed between the upper and lower two card cages. In such a case, this card cage depth would effectively partition the RF/microwave chamber (12) into two upper and lower isolated portions. In the second case, if the bandwidth requirements exceed the capacity of the RF/microwave chamber (12), then the intra-cabinet communication capacity may be increased by employing more than one RF/microwave chamber (12). This is a simple form of spatial division multiplexing in which the total communication requirement is partitioned among two or more RF/microwave chambers (12) that are intrinsically isolated from one another, but that nonetheless employ a means to intercommunicate. System communication capacity is enhanced when communication that is confined solely within a partitioned RF/microwave chamber (12) (i.e. local traffic) can occur independent from one another and thereby permit reuse of FDMA, TDMA, SDMA, PDMA, and CDMA resources (defined below).

Figure 13A:
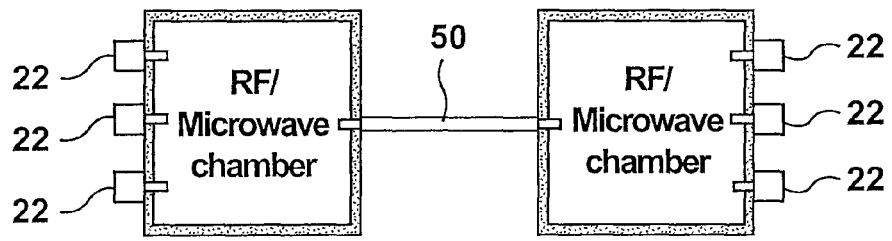
FIG. 13a illustrates a particular embodiment of the invention in which multiple RF/microwave chambers are connected via a passive interconnect with a coax or waveguide.

The present invention contemplates two principal methods for interconnecting isolated RF/microwave chambers (12), namely 1.) passive interconnection and 2.) active interconnection A passive interconnection is illustrated in FIG. 13a. An inter-chamber SISO radiating unit (22) is placed inside each of the isolated RF/microwave chambers (12) and these are interconnected via a waveguide or coaxial cable (50). In the passive realization (unlike the active realization) there are no intervening transceivers, therefore communication must be closely coordinated since there is no means to route inter-chamber traffic on different FDMA, TDMA, CDMA, or PDMA channels.

Figure 13B:
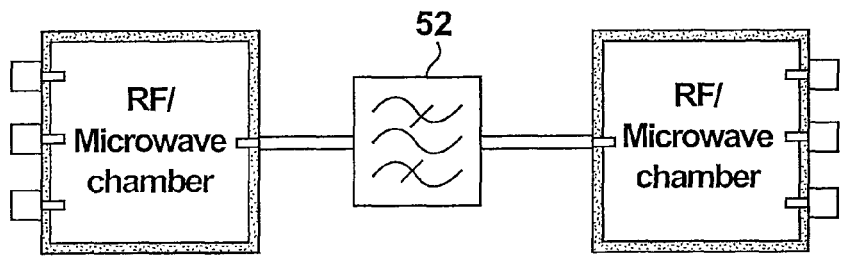
Figure 13C:
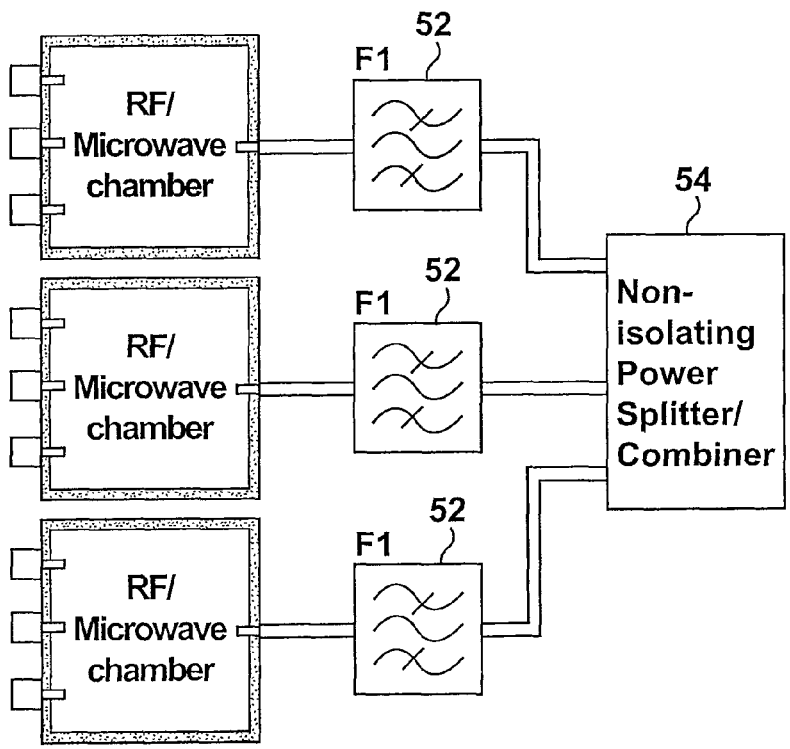
FIG. 13c illustrates a further particular embodiment of the invention in which three or more RF/microwave chambers are interconnected via a non-isolating Splitter/Combiner with optional bandpass filter.

Optionally, frequency isolation, and hence communication capacity enhancement, can be realized by interposing a known passive bidirectional filter (52) in the connection between the RF/microwave chambers (12) as shown in FIG. 13b and also between each connection between the RF/microwave chamber (12) and the power splitter/combiners (54), as illustrated in FIG. 13c. FIG. 13c also illustrates the intercommunication between more than two RF/microwave chambers (12) in a non-hierarchical peer-to-peer topology through the use of a known non-isolating (e.g. resistive) power splitter/combiner (54). In the particular embodiment shown in FIGS. 13b and 13c, the various RF/microwave chambers (12) see the traffic of the other RF/microwave chambers (12) symmetrically. In a non-hierarchical embodiment the filters (52) are tuned to the same frequency band. In this manner, all inter-chamber communication can transpire on one or more frequency channels within the filter pass band, and all local communication can transpire on all remaining channels.

Figure 13D:
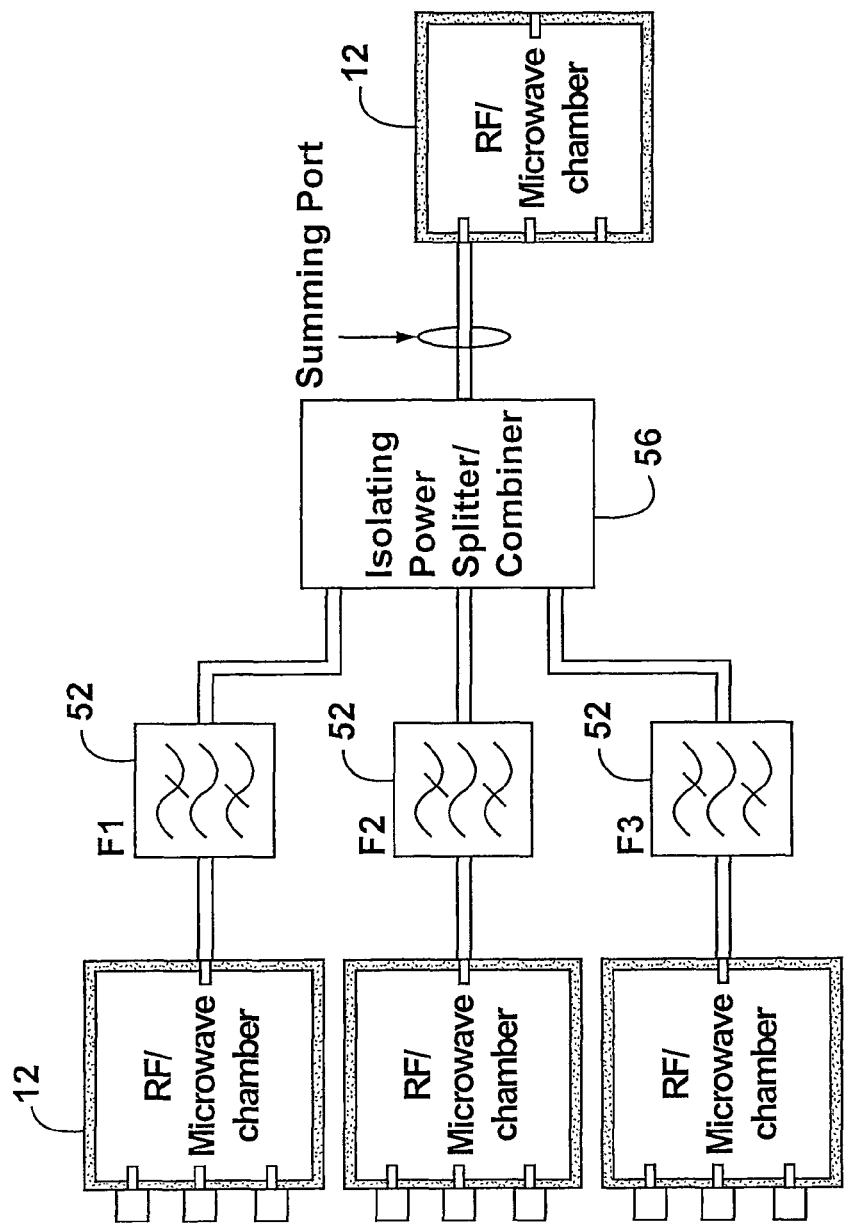
FIG. 13d illustrates another particular embodiment of the invention in which multiple RF/microwave chambers are connected hierarchically, in this case the three chambers at the lower hierarchical level direct all inter-chamber communication through the higher level RF/microwave chamber via coax or waveguide with a bandpass filter.

More than two RF/microwave chambers (12) can also intercommunicate in a hierarchical client-server topology as illustrated in FIG. 13d. In a preferred embodiment, a known isolating power splitter/combiner (56) (e.g. a WILKINSON™ splitter/combiner sold by Pulsar Microwave Corp.) is used to relay signals between each lower level RF/microwave chamber (12) and the higher level RF/microwave chamber (12) within the same hierarchy. No communication transpires directly between RF/microwave chambers (12) in the same level of hierarchy in this particular embodiment of the invention. In this embodiment, each filter (52) is tuned to a different frequency band to coordinate communication among all lower level hierarchical RF/microwave chambers (12) that share the same RF/microwave chamber (12) in the next higher level of hierarchy. The higher level RF/microwave chamber (12) of FIG. 13d will also choose to relay information to the next highest level in the hierarchy employing a frequency not used by the lower level RF/microwave chambers (12) in the same hierarchy.

Figure 13E:
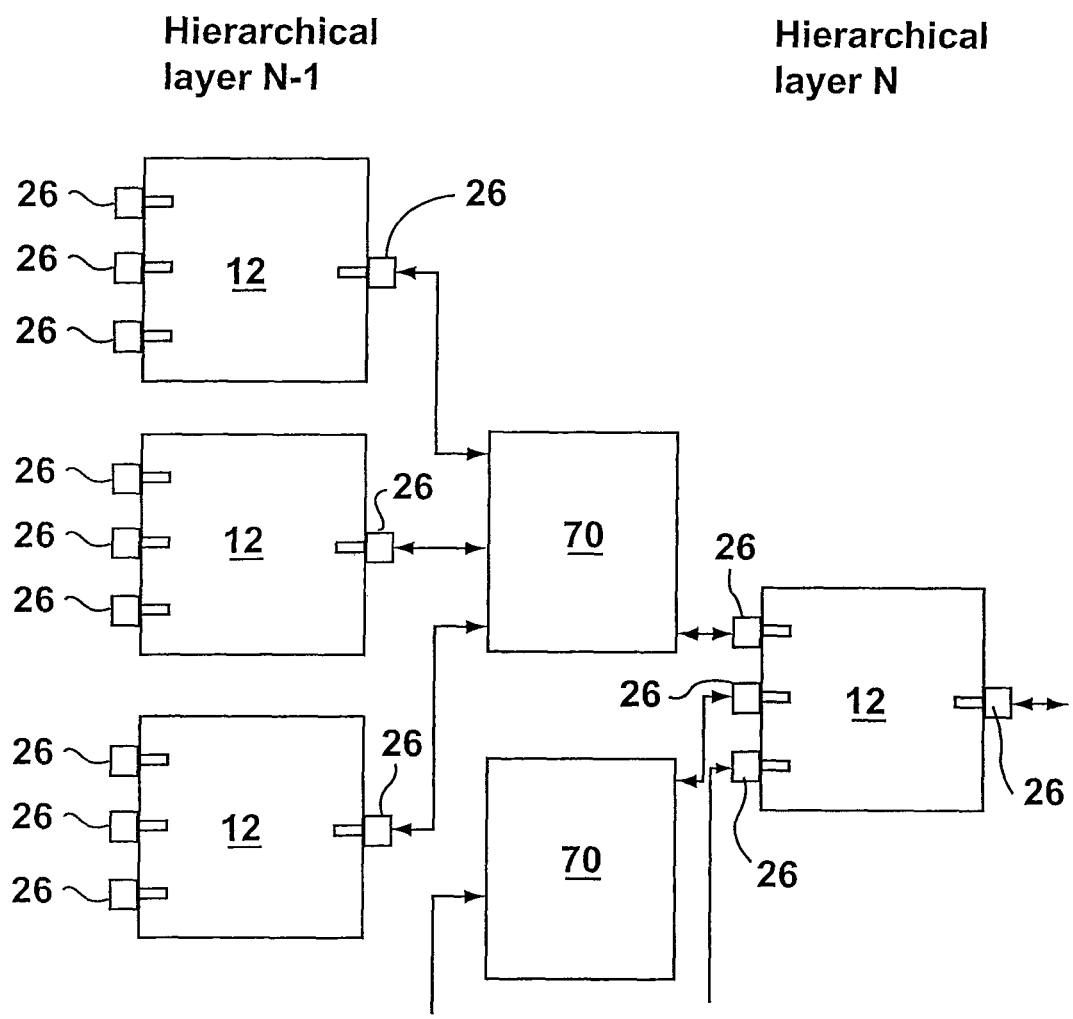
FIG. 13e illustrates yet another particular embodiment of the invention in which multiple RF/microwave chambers are connected, via a router that is connected to ICCUs for communication between RF/microwave chambers.

Active interconnect manifestations are as presented in FIG. 13e. One or more ICCUs (26) are placed inside each of the isolated RF/microwave chambers (12) and are interconnected to a router (70). In the active embodiment (unlike the passive embodiment discussed above) there are intervening transceivers: ICCU's (26) connected to the router (70) automatically extract only that information required for propagation outside of the RF/microwave chamber (12). The router (70) accepts channelized data from each source RF/microwave chamber (12), reorders it, and directs it to the intended destination RF/microwave chamber (12). It is understood that the hierarchy in itself does not achieve the enhanced communication capacity, rather the subdivision and hence isolation of signals local to each RF/microwave chamber (12) yields greater overall capacity in relation to a single RF/microwave chamber (12) serving the same ICCUs (26). Hierarchy, however, builds on the concept by defining a structured means to sub-divide communication across RF/microwave chamber (12) boundaries. In order to increase inter-chamber bandwidth the RF/microwave chamber (12) one can connect more than one ICCU (26) from within a particular RF/microwave chamber (12) to the router (70).

It should be understood that while FIGS. 11 and 12 illustrate the cross-sectional view of the cabinet (10) populated with four and eight rack mount card cages respectively, however, more or less are possible. Each card cage (18) may have one or more ICCUs (26), each including a radiating unit (22) that penetrates the RF/microwave chamber (12). Any ICCU (26) can communicate with any other ICCU (26) located within the same RF/microwave chamber (12) in this particular embodiment of the invention. The backplane (or midplane) embodiments described in this disclosure work well when the depth of the card cages (18) (or other collocated rack mount equipment) is similar. The frontplane embodiment described in this disclosure is generally preferred when the depth of the card cages and rack mount equipment collocated within a common cabinet (10) are different.

For the passage of optical signals no shielding is necessary. Optical waveguides can be passed through small holes (dimensions less than ½ wavelength of the highest spectral component) in the RF/microwave chamber (12) with minimal impact on its communication capacity.

It should be understood that the mid plane/back plane embodiment also contemplates the use of SISO and MIMO transceivers/radiating units.

Equipment collocated within a cabinet usually needs to intercommunicate in order to realize its system level functionality. The present invention enables intra-cabinet communication on a wireless basis by deployment of an RF/microwave chamber (12) as particularized above, in conjunction with a plurality of radiating units (22) designed to transmit and receive broadband signals. The RF/microwave chamber (12) offers a closed and therefore controlled environment which blocks outside electromagnetic interference and mitigates against multi-path signal distortion. Owing to its design, the RF/microwave chamber (12) of the present invention facilitates high bandwidth communication among radiating units (22).

It should also be understood that the present invention contemplates the use of static or dynamically steerable directional radiating units (22) (such as the particular steerable directional radiating units (22) mentioned above), thereby permitting the deployment of space division multiplexing so as to further enhance the communication capacity of the communication channels defined by the radiating units (22). For multipoint-to-multipoint communications, in order to realize the RF/microwave chamber (12) channel capacity, the air medium within the RF/microwave chamber (12) is divided into multiple channels. These channels can be divided across space, time, code, frequency and polarization domains. Each channel domain either individually or in concert with others has certain benefits that can be exploited as well as constraints that must be respected in order to ensure the formation of reliable high bandwidth connectivity. The efficient allocation of channel resources across domains within the confines of the RF/microwave chamber is achieved by operation of the special purpose transceiver (24) technology described below.

It is noted that recently there has been significant interest in the design and development of low cost transceiver chipsets suitable for transmitting high bandwidth signals over short distances in an open environment. These transceivers are primarily designed and marketed as a cable replacement for interconnecting high bandwidth consumer audio/video and computer components (e.g. wireless interconnect of a computer processor and display). To this end the FCC has allocated 7 GHz of spectrum in the 3 GHz-10 GHz range and defined regulations which, at a modulation rate of 1 bit per hertz, translates to a raw data throughput of 7 gigabits per second. Higher throughputs are possible if more complex modulation schemes are employed and the properties of the channel (i.e. RF/chamber) can be exploited. The IEEE is in the process of defining a personal area network standard to ensure interoperability among equipment vendors. When ratified, the IEEE 802.15.3a personal area network specification should facilitate the widespread deployment of low cost Ultra-Wide-Band 802.15.3a compliant transceivers. With suitable modifications these transceivers can be repurposed for broadband communication within the RP/microwave chamber (12) of the present invention.

It should be understood that the ICCUs (26) referred to herein throughout: 1.) effect communication among card cages (18) or 2.) effect communication among circuit packs (14).

Figure 4:
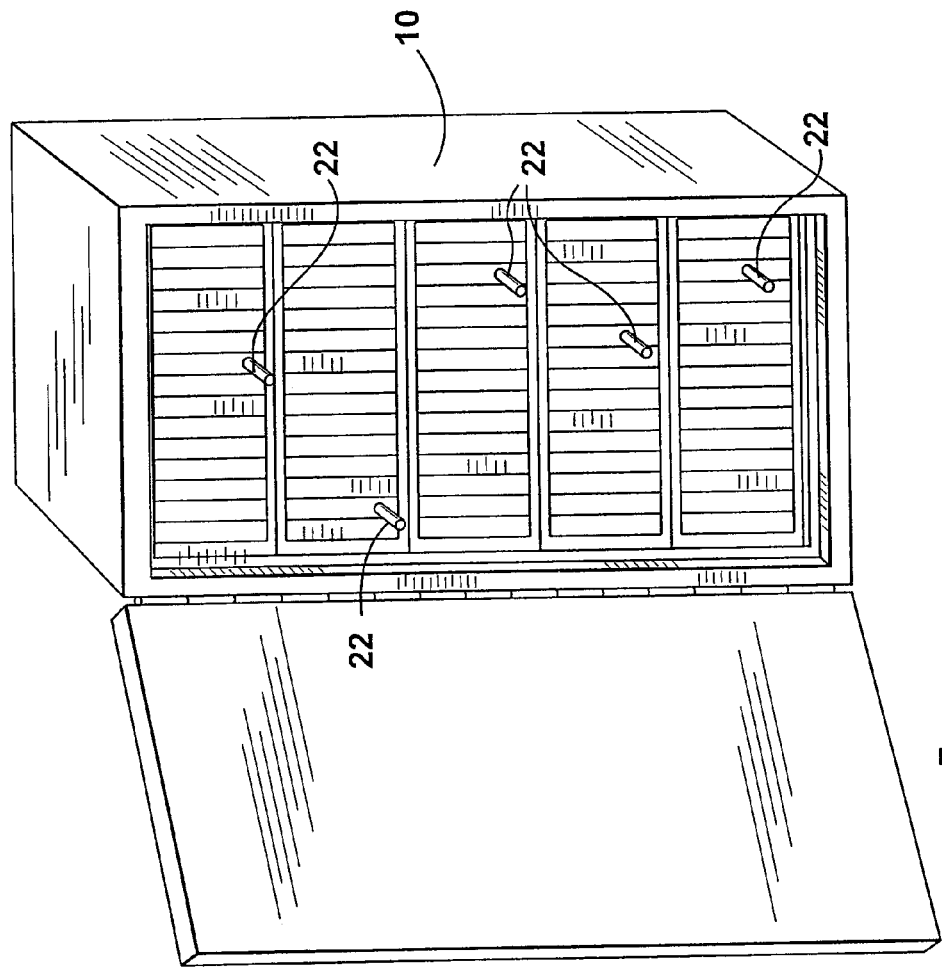
FIG. 4 is a further perspective view of the cabinet, illustrating within the cabinet the RF/microwave chamber of the present invention.

It should be understood that in many specific deployments of the present invention to provide the desired characteristics thereof to a cabinet (10), card cages (18) may deploy a PCB backplane or midplane (as described above) which serves to deliver power to the circuit packs (14) installed within the card cage (18). The midplane or backplane of the card cage (18) can also deploy wired buses (realized in the form of PCB tracks etched onto the backplane/midplane PCB) or other wired interconnect structures to facilitate circuit pack communication within a card cage (18). In this case, the primary function of the ICCUs (26) is to facilitate communication among card cages (18) that share the same RF/microwave chamber (12). To this end, FIG. 4 illustrates one ICCU (26) per card cage (18).

More than one ICCU (26) per card cage (18), however, is desirable for a number of reasons including: 1.) to increase the card cage's communication bandwidth; 2.) to introduce redundancy in devising fault tolerant topologies, and (3) to effect communication within a card cage (18) between the various circuit pack modules (14) disposed in such card cage (18). A particular embodiment in which such intra-card cage communication is provided is shown in FIG. 8 (more than one ICCU (26) in one of the card cages).

It is possible that each ICCU (26) will only be able to access a subset of the RF/microwave chamber communication capacity. As an example, consider a frequency division multiplex scheme whereby the RF/microwave chamber (12) is channelized in the frequency domain. In this case the ICCU (26) might only be capable (i.e. by design) of processing a single frequency carrier at a time. A card cage (18) that deploys more than one ICCU (26) can therefore access more than one frequency channel at a time thereby increasing its bandwidth to communicate with other ICCUs (26) within the RF/microwave chamber (12).

High reliability applications often necessitate the use of redundant communication transceivers to improve operational "uptime" in the event of a component failure. FIG. 8, for example, illustrates one possible configuration whereby the second card cage (from the top) employs two ICCUs (26), either of which may be configured at any given moment in time to communicate with other card cage ICCUs (26) via the RF/microwave chamber (12).

Finally, multiple ICCUs (26) can be used within a card cage (18) to facilitate intra-card cage communication. Intra-card cage circuit pack communication has historically been conducted via backplane/midplane PCBs, however, based on current wireless technology referenced in this disclosure, wireless interconnect is a viable alternative. The present invention provides means for leveraging such wireless interconnect technology in conjunction with the cabinet (10) and the components stored within same.

In addition, ICCU implementation on circuit pack modules (14) newly introduced to certain legacy systems permits the in-field expansion of the intra-card cage communication capacity without having to change the card cage's backplane/midplane PCB thereby resulting in cost savings of personnel time and equipment.

To facilitate multipoint-to-multipoint wireless communication the air medium within the RF/microwave chamber (12) is channelized or "Divided" to permit shared use or "Multiple Access" of the medium among all communicating devices, including the ICCUs (26). Perhaps the simplest form of dividing the air medium is by time. In Time Division Multiple Access (TDMA) systems each communicating device is allocated a short duration of time (i.e. timeslot) during which it may transmit. Each transmitting device's timeslot typically occurs in an ordered periodic sequence. In Frequency Division Multiple Access (FDMA) wireless systems, the frequency spectrum of the air medium is portioned off to different devices and allocated for that communication duration. Each transmitting device transmits on its own unique frequency permitting simultaneous communication among all devices. In Code Division Multiple Access (CDMA) wireless systems each transmitting device is assigned a unique (and preferably orthogonal) code. In this manner the transmitting device is permitted to access all bandwidth of the air medium as in TDMA for the complete duration of the communication as in FDMA. All users have access simultaneously to the entire air medium spectrum for all time. Typically, in direct sequence CDMA systems the signal to be transmitted is spread over the entire air medium spectrum using a code. The signal is received by convolving the received signal with the same code used in its transmission. In this manner, signals that are transmitted using different codes manifest as noise in the de-convolved receive signal. In frequency hopping CDMA systems the transmit carrier frequency changes as a function of time in an ordered fashion. In Spatial Division Multiple Access (SDMA) wireless systems, the air medium is partitioned into geographical subspaces whereby each subspace is essentially independent. The air medium communication capacity is significantly enhanced due to carrier frequency and code reuse across each subspace coincident in time. The size and number of sub-spaces can be increased through judicious control of antenna directivity and transmit power. In Polarization Division Multiple Access (PDMA) wireless systems the electric field component of each transmitting device is assigned a unique spatial orientation (e.g. horizontal or vertical polarization).

It should be understood that all of the above multiple access systems are complimentary in that they can work in concert with one another to effect multiple access, in a manner that is known.

Transceiver

As stated earlier, for multipoint-to-multipoint wireless communications within the cabinet (10), in order to achieve functionality and to realize the RF/microwave chamber's (12) communication capacity, the air medium within the RF/microwave chamber (12) is preferably divided into multiple logical channels. Channel division can occur across space, time, code, frequency and polarization domains. Each channel division domain either individually or in concert with others has certain benefits that can be exploited as well as constraints that must be respected in order to ensure the formation of reliable high bandwidth connectivity within the cabinet (10) of the present invention. Another aspect of the present invention is a system and a method that enables the efficient allocation of channel resources across domains within the confines of the RF/microwave chamber (12) of the present invention. Specifically, this system aspect of the present invention is best understood as a particular embodiment of the ICCU (26) that is operable to permit the management of bandwidth for intra-chamber communication within the cabinet (10) of the present invention, which is referred to in this disclosure as the intra-chamber wireless transceiver or ICWT (42) (also referred to as a "wireless transceiver"), which is best understood as a particular embodiment of the transceiver (24) that is part of the ICCU (26).

As also stated earlier, it should be understood that recently there has been significant interest in the design and development of low cost transceiver chipsets suitable for transmitting high bandwidth signals over short distances in an open environment. These transceivers are primarily designed and marketed as a cable replacement for interconnecting high bandwidth consumer audio/video and computer components (e.g. wireless interconnect of a computer processor and display). Again, the present invention contemplates use of such technology in providing the transceiver (24) of the present invention.

Figure 14:
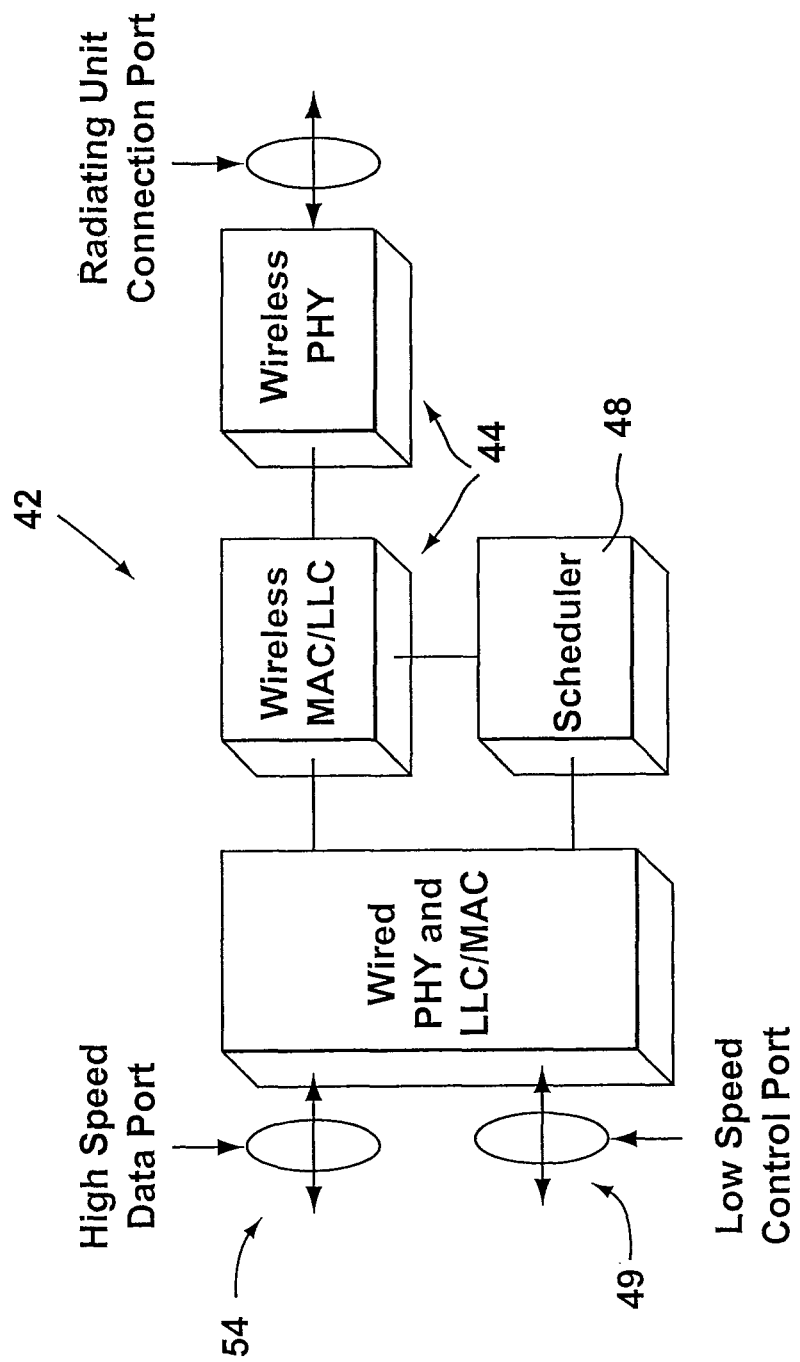
FIG. 14 illustrates the principal resources of the ICWT of the present invention, in one embodiment thereof.

The principal functional elements of the ICWT (42) are: (A) a wireless interface means (44) (B) a wired interface means (46), and (C) an intra-chamber communication management utility or scheduler (48) of the present invention, as illustrated in FIG. 14. In a particular embodiment of the invention, illustrated in FIG. 14, the wireless interface means (44) consists of a known wireless Physical Layer Device (or "Wireless PHY"), and a known wireless medium access control and link layer controller or "Wireless MAC and LLC"; and the wired interface means (46) consists of a known wired Physical Layer Device, and a known wired medium access control and link layer controller or "Wired PHY, MAC and LLC". It should also be understood that the elements are referenced in conjunction with the IEEE standard, however, it should be understood that the PHY, MAC and LCC blocks can be collapsed into a single block.

Figure 15:
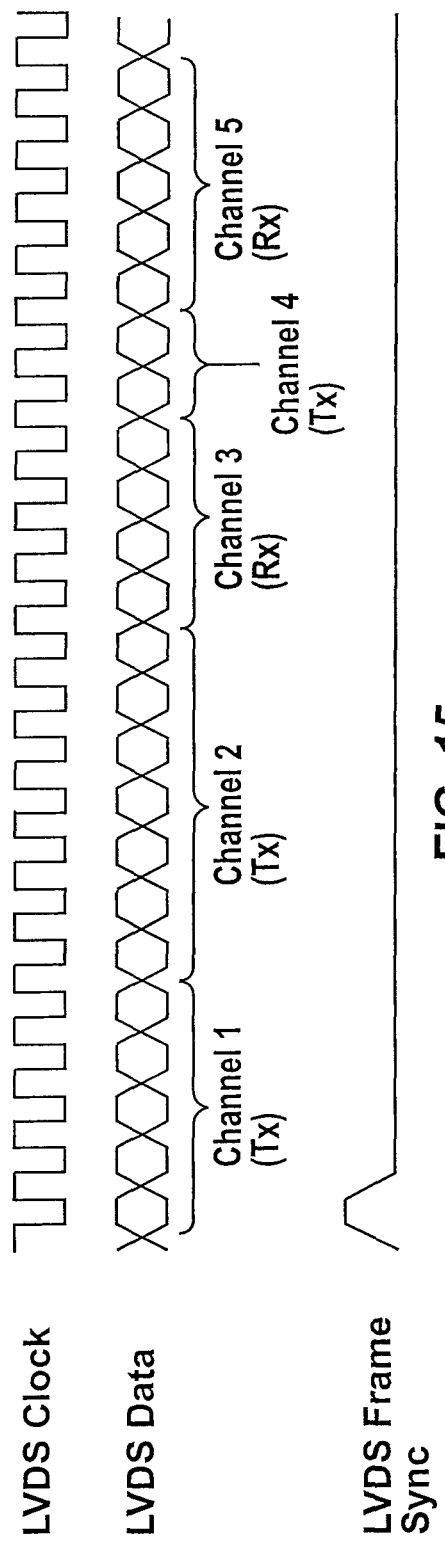
FIG. 15 illustrates the creation of wired side "channels" for communication within the RF/microwave chamber, by operation of the ICWT.

The Wired PITY and MAC/LLC block services the high speed wired port(s) and includes wireline transceivers, Phase Lock Loops ("PLL's"), and buffers for clock and data synchronization. Physically, the high speed ports connect to external data sources and sinks, can be either serial or parallel, and can be channelized across space and/or time. FIG. 15 shows timing signals of one embodiment of the present invention in which a wired high speed transceiver (not shown) is configured as a serial LVDS interface in half duplex mode to receive and transmit constant bit rate isochronous time division multiplexed data intended for wireless transmission via an ICWT with radiating unit installed within the RF/microwave chamber (12). The ICWT (42) behaves as a master in so far as it provides the clock and a frame synchronization pulse for both the upstream and down stream LVDS data. Other configurations are possible. For example, the ICWT can be realized as a slave device wherein wireline data is timed to an externally provided local clock. In this particular embodiment, receive and transmit wireline data must be retimed to the wireless clock to which all wireless transmissions within a given RF/microwave chamber (12) are synchronized. Retiming of data necessitates the deployment of buffers within the ICWT. Other wired interfaces and variations are possible: A. Both channelized and non-channelized data can, for example, be spatially multiplexed across multiple physical high speed ports. B. Physically separate transmit and receive ports can be allocated to facilitate full duplex operation. C. Data can be presented in a serial format, parallel format or combination thereof. D. Digital input and output signals can comply with TTL, CMOS, and ECL standard logic levels. E The wired interface may be adapted to accommodate variable bit rate data. In this case an additional physical or logical signal would be required to demarcate individual variable length channel data. F. The wired interface may be provided through the deployment of industry standard physical layer interconnect including USB, IEEE 1394, and Ethernet (100baseT, 1000baseT, 100base2).

Although this particular feature is not illustrated, it is important to understand that to support isochronous operation, PLLs are generally required for the derivation of FIG. 15's LVDS clock and frame synchronization signals from the internal clock of the ICWT (42). The ICWT's (42) internal clock is in turn derived from either the incoming symbol timing of a wireless data stream, or an externally provided clock reference. In this manner, the ICWT (42) can be configured to provide a global clock signal for the synchronization of all intra-chamber ICCUs.

The ICWT (42) is linked to a control port (49), as illustrated in FIG. 14. It should also be understood that, in a particular embodiment of the present invention, the wired PHY, MAC and LLC is operable to provide the control port (49), which in this embodiment consists of a low speed control port (49) for interconnection to an external host processor (not shown). The low speed port (49) is used to initialize the ICWT (42) and to request the setup and tear down of connection oriented logical channels between ICWTs (42). Physically, the low speed control port (49) can be serial or parallel and, in a very particular embodiment, control and configuration data can be written to or read from the ICWT (42) via memory mapped registers (not shown) linked to the external host processor). The clock and frame synchronization rates are also programmable through the low speed control port (49). Configuration changes in the time division multiplex ("TDM") format initiated through the low speed control port (49) are synchronized to subsequent frame synchronization signals, for example, ensuring that any changes made to the manner in which communication occurs are synchronized to a reference point common to both the ICWT (26) and the external wired transceiver (24) to which the ICWT (26) is connected. In this particular embodiment of the present invention, a frame synchronization signal is used as the common reference point. Optionally, this physical low speed control port (49) can be eliminated by allocating its functionality to a channel within the high speed port (54) described below, which provides the functions of the control port (49) to the ICWT (42) in this embodiment of the invention.

Connection requests initiated through the control port (49) (whether it is the low speed control port (49) or the high speed port (54) are passed along to the scheduler (48) for reconciliation. If and when the scheduler (48) reconciles connection resources, it instructs the Wired PHY and MAC/LLC block to allocate necessary additional channel resources on the high speed port (54).

The Wireless PHY block of FIG. 14 processes RF/microwave signals present at the radiating unit interconnect port (58) shown in FIG. 14. This port connects the ICWT (42) to the radiating unit (22). In a preferred embodiment of the present invention, this interconnect port (58) carries conducted UWB signals that comply with FCC and/or 802.15.3a specifications. The interconnect port (58) itself has different manifestations dependent on the radiating unit's (22) SISO or MIMO capabilities and balanced or unbalanced configuration. SISO systems have one radiating element and MIMO systems have more than one radiating element. The radiating elements (that comprise the radiating unit (22)) themselves can be different in terms of directionality, efficiency, and characteristic impedance. In MIMO systems (as compared to SISO systems) the ICWT (42) has the added responsibility of coordinating the signals among all radiating elements to form a directional beam. For phased array MIMO systems, the ICWT (42) achieves beam forming by adjusting the relative amplitude and phase of each radiating element's interfacial signal. In switched MIMO systems the ICWT (42) selects the radiating element or radiating elements whose fixed directivity is most closely aimed at the targeted distant radiating unit or radiating units. Other known MIMO systems, including switched/phase array hybrids, are possible. U.S. Pat. No. 6,049,307 provides one example of an adaptive phased array.

For each radiating element within a radiating unit two possibilities exist: a balanced system or an unbalanced system. In a balanced system, signals from/to each of the radiating elements within a radiating unit are differential and symmetric about ground whereas in an unbalanced system the signal from/to the radiating elements within a radiating unit is ground referenced.

It should be understood that other specific implementations are possible, including for example in relation to the definition of the port interface. Also, as another example, the beam forming functionality can be relegated to the radiating unit (22) without departing from this disclosure.

Responsibilities of the wireless PHY of FIG. 14 typically include radiating unit impedance matching, RF/microwave pre-filtering and amplification, local oscillator frequency synthesis, signal up/down conversion, A/D and D/A conversion, signal modulation and demodulation, channel coding, and in the case of MIMO radiating units (22), dynamic beam forming.

The wireless MAC/LLC block of FIG. 14 is responsible for: (1) Establishing and maintaining timing synchronization among all ICWTs; (2) Managing access to contention/random access channels; (3) Acting on and maintaining the continuous transmission and receipt of data across time, frequency, space, code, and polarization channels as directed by the primary ICWT's scheduler (48).

The scheduler (48) illustrated in FIG. 14 is responsible for the optimal allocation of wired time and space channels and wireless time, space, frequency, code, and polarization channels to effect transfer of high speed data among all ICWTs (42) associated with the RF/microwave chamber (12). Formulation of the scheduler's (48) primary function can be stated as follows: given a number of connections to be routed, each with corresponding quality of service parameters (such as Jitter Tolerance, Bandwidth Requirements, Error Rate Tolerance, and Latency Tolerance), the scheduler (48) is operable to allocate time, frequency, space, code, and polarization channels as appropriate from wired interface to wired interface through the RF/microwave chamber (12) in such a manner so as to optimize overall performance.

Additional ancillary tasks of the scheduler (48) include the following: (A) ICWT node discovery—all ICWTs (42) broadcast their presence on a contention/random access logical channel. (B) Assignment of a master ICWT (42)—in the preferred embodiment all ICWTs (42) are identical in functionality to ensure maximum interoperability and fault tolerance. At any given time, however, only one ICWT (42) will be responsible for routing table decisions. This master ICWT can delegate processing to other ICWTs (42) but is ultimately responsible for broadcasting its routing table decisions to all ICWTs (42) so that any ICWT (42) can assume the role of master ICWT (42) should the current master ICWT fail (42). This redundancy feature is important for fault tolerance networking in high availability applications. Choice of the master ICWT (42) is preferably arbitrary and can be subject to a pseudo random selection process, in a manner that is known.

(C) ICWT geographical location discovery: the relative coordinates of each ICWT (42) is computed by triangulating Receive Signal Strength Indication (RSSI), Time Of Arrival (TOA) and/or Angle Of Arrival (AOA) data, in a manner that is known. This data is used to determine requisite transmit power and assess adjacent and co-channel inference associated with a particular channel routing.

(D) RF/microwave chamber environment discovery: for MIMO systems that employ electrically steerable directional radiating units (20) and possible passive reflectors internal to the RF/microwave chamber (12), the scheduler (48) can be used to derive the electromagnetic properties of the RF/microwave chamber (12). To characterize in the frequency domain, for example, each individual ICWT (42) is operable to receive programming to in turn transmit on a fixed frequency channel while sweeping angularly through one full azimuth circle, with all remaining ICWTs (42) programmed to receive signal amplitude data by angularly sweeping over one full azimuth circle for each azimuth increment of the transmitter that is part of the transceiver (26). This process is repeated for each frequency channel and the resultant data can be readily analyzed to determine the RF/microwave chamber's (12) frequency and spatially dependent reflection/absorption properties. For active/programmable reflectors, the process detailed above can be repeated for each new configuration setting of the reflector. Other characterization methods are possible (i.e. time domain).

Simplifications to the procedure above are possible with a priori information about the RF/microwave chamber (12) and its various facets described. As an example, for static RF/microwave chamber (12) environments, analytic characterization data which may or may not include radiating units can be preprogrammed into the scheduler.

(E) Ongoing monitoring/reporting of channel status (Bit Error Rate, ICWT node presence etc.).

(F) Continuous reconciliation of primary ICWT routing table data.

The following inputs are either directly programmed into the scheduler (48) or computable by the scheduler (48) from RF/microwave chamber characterization data gathered by the scheduler in (C) and (D) above: (A) the relative location of all radiating units (22) within the RF/microwave chamber (12); (B) radiating unit (22) directivity and MIMO capabilities; (C) for MIMO systems, frequency and spatially dependent reflection/absorption properties of the RF/microwave chamber (12); and (D) the number of connections requiring routing each with their source and destination addresses and corresponding QOS parameters: jitter tolerance, bandwidth, error rate tolerance, and latency.

For the sake of clarity, latency tolerance as a QOS parameter defines the degree to which a given connection can tolerate delay in transmission of data. A two way voice connection, for example, can tolerate very little delay before comprehension is impaired. Connections for file download off the Internet, however, can tolerate a high degree of latency without compromising communication integrity. Jitter Tolerance as a QOS parameter defines the degree to which a given connection can tolerate variability or uncertainty in arrival time of the next piece of information. Generally speaking, if transmitted information is the subject of a stochastic process, then latency would be its expected value, and jitter would be its variance. The Error rate tolerance QOS parameter defines the degree to which a given connection can tolerate errors in the transmission of information. Voice connections, for example, can tolerate significant impulse noise without significant loss of comprehension. Data files of computer programs, however, cannot be expected to function with a single bit error.

These aforesaid parameters are input via the wired low speed control port (49) at the time a connection request is made. There are also intrinsic ICWT transceiver performance parameters that include: receive sensitivity, maximum transmit output power, tolerance to co-channel interference, and tolerance to adjacent channel interference. It should be understood that the scheduler (48) is operable to provide programming for each of the foregoing parameters.

The outputs of the scheduler (48) include, time, frequency, code, spatial, and polarization channel assignments along with transmit power. The scheduler (48) maintains a database of allocated connection records as per FIG. 17. Many of the fields shown are not required. A SISO radiating unit (22), for example does not employ spatial multiplexing and so these fields can be omitted in the SISO type implementation.

When the scheduler (48) assigns RF/microwave chamber (12) channels, transmit power, and wired channels it accounts for the following. (A) When assigning frequency division channels coincident in time, the scheduler (48) considers that adjacent channel power unintentionally received by a ICWT (42) might mask or otherwise impair its intentional receive signal if the received power of the intentional signal is significantly less than the received power of the adjacent signal. At moderate interference levels the impairment manifests as an increase in an error rate and is compared to the connection's stipulated tolerance to the error rate QOS metric prior to allocation. At severe interference levels no connection can be established. (B) When assigning spatial division channels coincident in time, the scheduler (48) accounts for imperfect RF/microwave chamber (12) absorption, and the spatial radiation power pattern of the transmit and receive radiating units (22). Unintentional cross channel coupling through off-axis radiation and/or from reflections off of imperfect RF/microwave chamber (12) absorbing facets (30) contribute to co-channel interference. At moderate interference levels the impairment manifests as an increase in error rate and is compared to the connection's stipulated tolerance to the error rate QOS metric prior to allocation. At severe interference levels no connection can be established. (C) When assigning code division channels coincident in time, the scheduler (48) attempts to ensure that: the receive signal strength of two or more signals received simultaneously at a given ICWT (42) are comparable, and the receive strength of an intended signal is greater or equal to the receive strength of an unintended signal. At moderate levels of noncompliance the impairment manifests as an increase in error rate and is compared to the connection's stipulated tolerance to error rate QOS metric prior to allocation. At severe interference levels no connection can be established. (D) When assigning wired and RF/microwave chamber (12) time channels, consideration may be given to the connection's stipulated tolerance to latency and jitter QOS metrics. For latency sensitive connections the scheduler (48) can assign time division channels that are progressively later in time from source to destination so as to eliminate or minimize the introduction of frame delays. For jitter sensitive connections the scheduler (48) can allocate excessive channel bandwidth to ensure data arrives with reduced latency variance. (E) As new connection requests are made, previous allocations may require reassignment so as to either avoid or minimize blocking (i.e. inability to fulfill all connection requests) and/or to maximize overall QOS metrics. (F) The ICWT (42) transmit power level is greater than the sensitivity of the ICWT receiver plus the path loss between transmitter and intended receiver (which accounts for signal diffusion and receive antenna effective area) less the gains of the transmit and receive radiating units (22). With knowledge of the RF/microwave chamber (12) geometry, path loss is determined from the distance between transmit and receive radiating units (22). Alternatively, path loss may be derived directly through empirical measurement. The ICWT (42) transmit power must be less than its transmit power output capacity. (G) The number of channel allocations per connection is in proportion to the connection bandwidth QOS metric.

In the most general case, the scheduler (48) is operable to provide channel allocation by formulating a non-linear optimization problem. The constraints and objectives stipulated above can be readily expressed mathematically through relational constraints and weighted objectives, in a manner that is known, and also as is described in "Nonlinear Programming: Theory and Algorithms", by Mokhtar S. Bazaraa and C. M. Shetty, John Wiley and Sons, 1979. ISBN 0-471-78610-1.

For a small number of channel resources, the scheduler (48) is operable to perform optimal channel assignment using an exhaustive search method whereby every possible solution is enumerated and evaluated according to an objective function thereby facilitating the discovery of the global optimal solution (rather than a local optima). Exhaustive searches are only practical in small "contained" optimization problems. More generally, where a larger number of channel resources exist, the scheduler (48) is operable to solve the non-linear optimization problem using known optimization algorithms including steepest decent, simulated annealing, simulated evolution etc. These techniques are well known, and are explained, as an example, in the "Algorithms and Theory of Computation Handbook", by Mikhail J. Atallah, CRC Press 1999. The performance of these methods is dictated by the number and nature of constraints (i.e. whether they form a convex hull), the objective function, the processing power of the scheduler (48), and the maximum allotted time to establish a new connection. Model simplification, linearization, and/or the application of heuristics may result in the simplification of the problem such that it can be solved in shorter time, recast as a linear programming problem, or otherwise expressed in closed form respectively. The choice of the exact method to be implemented in accordance with the invention described, in particular cabinet conditions, depends to some extent on the exact deployment of the technology described in this disclosure. These methods and their implementation, however, are well known. Generally speaking it should be understood that the problems resolved by operation of the scheduler (48) of the present invention can be readily cast and solved by those skilled in the art of non-linear optimization. Non-linear optimizations have the following characteristics. First, a non-linear objective function formulated from one or more potentially competing objective variables. Weights can be assigned to each objective variable to specify relative performance in trading one objective for another. Second, a set of non-linear equality and inequality constraints relating to objective variables, so as to define a space within which a possible solution exists. The "best" solution is one which either maximizes or minimizes (depending on the objective function formulation) the "objective" as measured by the objective function.

The present invention also contemplates the use of the ICWT (42) described to implement particular methods for achieving desirable bandwidth performance within the RF/microwave chamber (12) described. These methods include optimizations of trading off efficiency, execution time, memory utilization, solution quality etc.

Optionally, the scheduler (48) is operable to implement more than one algorithm This can be achieved in accordance with a number of known methods including implementing the algorithm to hardware that is part of or linked to the ICWT (42) or stored in memory for execution on a microprocessor (not shown) that is linked to or part of the ICWT (42), or part of an external host processor linked to one or more ICWTs (42). Either way, the scheduler (48) is operable by virtue of such algorithm to solve for channel assignments. The choice of which algorithm to use may be made either manually or automatically. An automatic decision would require the input of "maximum time to establish a new connection" parameter to help guide the selection. These algorithms as provided in a manner that is known, including based on the information set out in this disclosure.

Therefore, physically, the scheduler (48), in one particular embodiment thereof, can be realized via a microprocessor with sufficient memory to store and run a variety of embedded optimization algorithms.

While the scheduler (48) within the master ICWT (42) is responsible for determining channel allocations, a master scheduler (48) (i.e. one particular scheduler (48) of the plurality of schedulers (48)) can, in a particular implementation, execute the channel allocation algorithm on its own or partition the task into sub-tasks to be run in parallel on slave schedulers (48). This distribution of the scheduler (48) functions can be readily implemented by those skilled in the art.

One way to improve the reliability of a system is to employ redundant sub-systems placed in "hot standby" mode whereby each sub-system is operable to assume and sustain the functionality of the failed sub-system without significant interruption. It should be noted that the master scheduler (48) coordinates all communication within the RF/microwave chamber (12) and its failure would be catastrophic in that no intra-chamber communication would likely transpire. As suggested above, for high reliability applications the system reliability would therefore be improved if a redundant scheduler (48) were employed which could assume functionality upon failure of the master scheduler (48). For fault tolerant applications therefore (i.e. high reliability intra-cabinet communication), each slave scheduler (48) can be configured to independently compute channel allocations. These results can be subsequently compared to those of the master scheduler (48) to ensure proper operation. When results disagree, an "odd man out" or majority rule policy can be instituted whereby the scheduler (48) that makes routing decisions contrary to the majority of schedulers (48) associated with a particular RF/microwave chamber (12) is deemed to be in error and therefore unfit to be a master scheduler (48). If the unfit scheduler (48) is currently a master scheduler (48) then a new master scheduler (48) would need to be allocated. System implementations of this type are well known to those skilled in the art.

First Planar Embodiment

Figure 16:
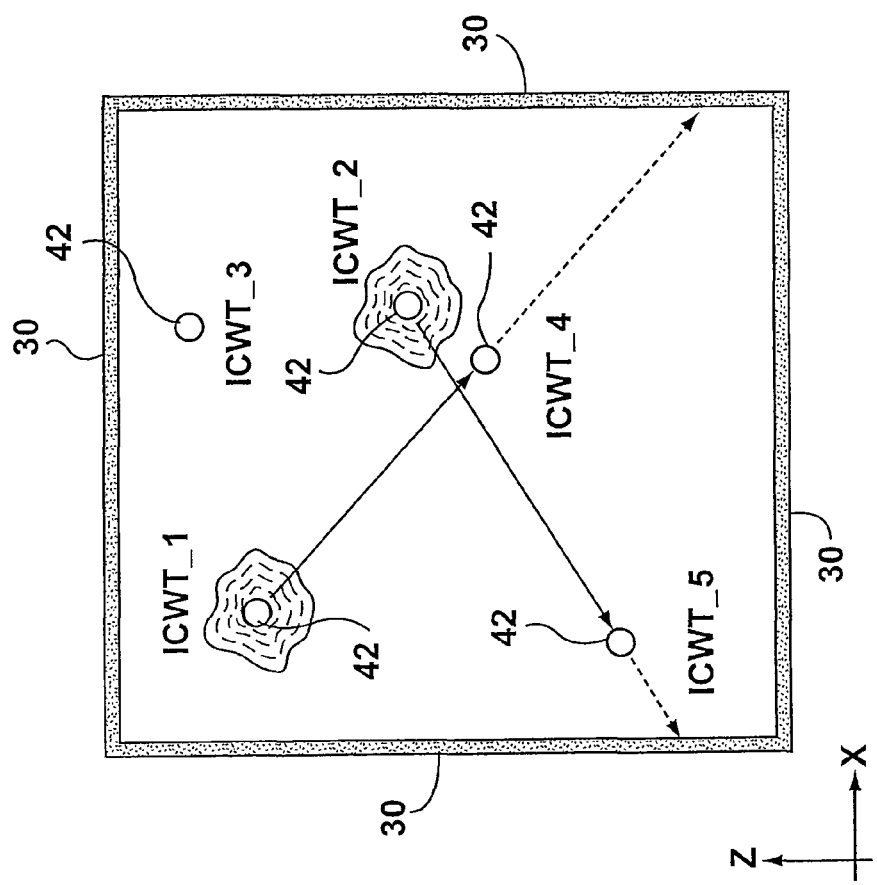
FIG. 16 is a cross-sectional view of the planar RF/microwave chamber, illustrating intra-cabinet communication within the RF/microwave chamber in the presence of five omni-directional ICWTs.

In the specific embodiment of the present invention illustrated in FIG. 16, the planar RF/microwave chamber (12) employs two proximate parallel plates separated in the "Y" direction by at least ½ of the wavelength of the lowest signal frequency component. All perimeter facets (30) are constructed from frequency absorptive material. The air medium is subdivided into frequency and time channels. Spatial, code, and polarization division multiplexing are not utilized in this embodiment.

Omni-directional SISO radiating units (22) linearly polarized in the "Y" direction are employed and radiation propagation is confined within the XZ plane of the planar RF/microwave chamber (12). For illustrative purposes, 5 ICWTs (42) are shown in FIG. 16.

Time channels are further subdivided into contention and contention free channel types. Contention channels are typically used to convey low bandwidth control information among ICWTs (42) for initialization, synchronization, and management while contention free time channels are allocated by the scheduler (48) to establish deterministic connectivity among ICWT (42) units. Time channels are organized into frames where each frame or collection of frames is demarcated by a beacon signal which is used for synchronization.

To illustrate scheduler (48) functionality, assume two connection requests are made of the scheduler (48):

(I) ICWT_1 transmits to ICWT_4
(II) ICWT_2 transmits to ICWT_5

When contemplating coincidental scheduling of these connections, the following observations are made: (A) The separation between the transmit and receive ICWTs or each of the two connections and therefore the path loss of connection "I" and "II" above are comparable. (B) For equal transmit powers, ICWT_4 will receive more unintentional signal power from ICWT_2 than intentional signal power from ICWT_1. (C) Due to comparable distances, ICWT_5 will receive approximately the same amount of unintentional signal power from ICWT_1 as intentional signal power from ICWT_2. (D) To avoid performance degradation due to adjacent channel interference, the scheduler (48) is operable to consider: (a) Boosting ICWT_1's power relative to ICWT_2's power, and/or (b) to not employ adjacent frequency channels. (E) Boosting ICWT_1's power will degrade ICWT_5's receive performance and is therefore not a valid option.

Figure 17:
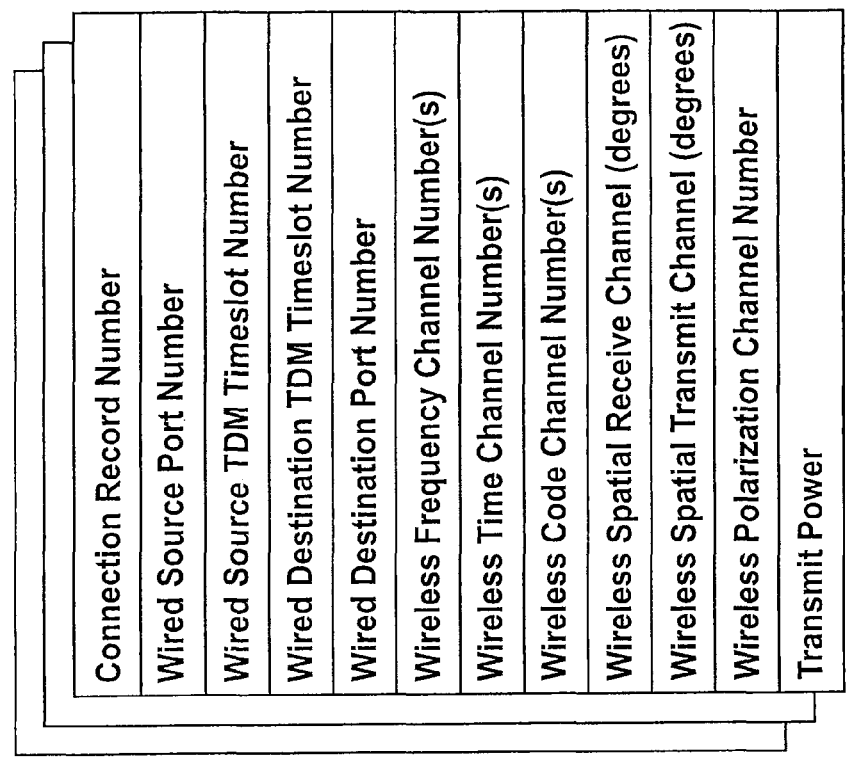
FIG. 17 is a routing table database illustrating connection records and record fields.
Figure 18:
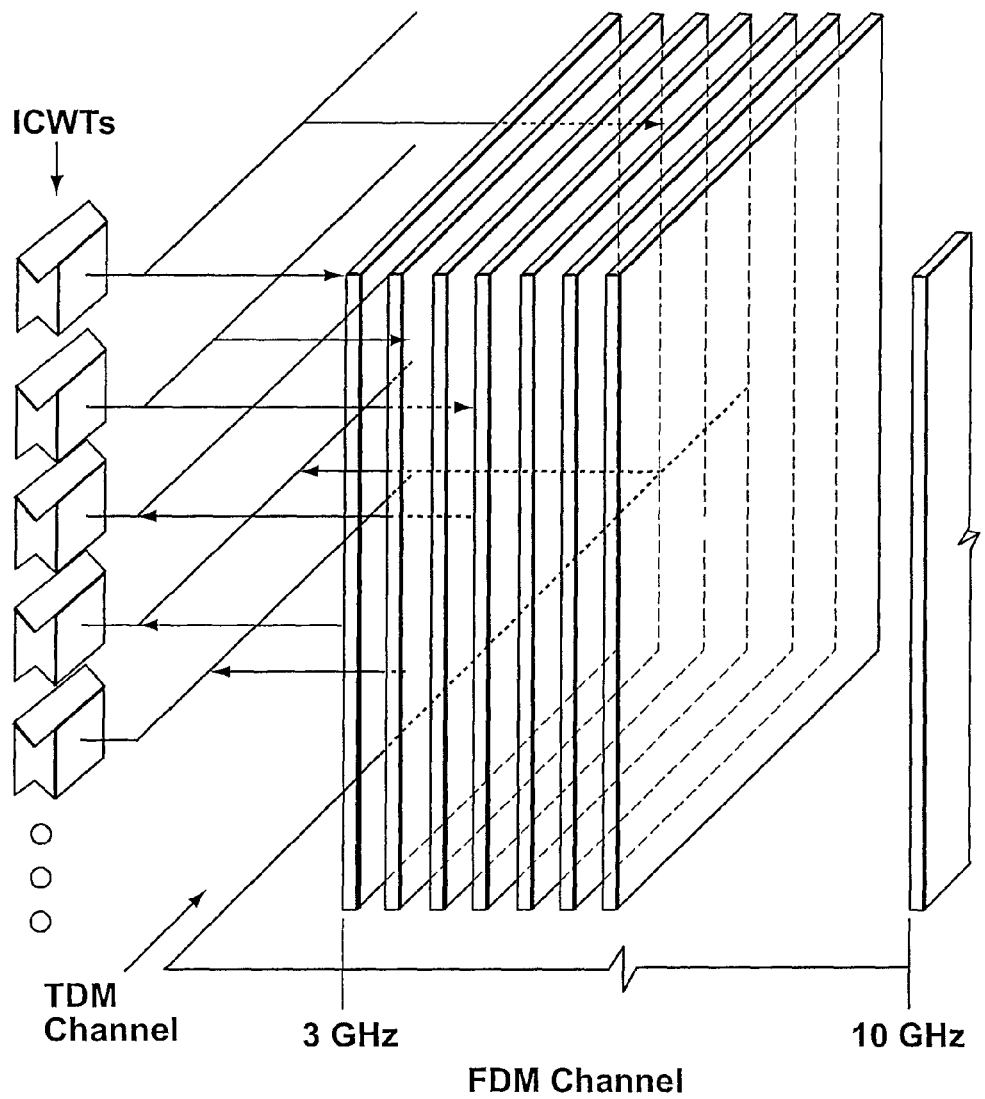
FIG. 18 illustrates allocation on the TDMA and FDMA channels in the RF/microwave chamber, by operation of the ICWT's.

The scheduler (48) is operable to choose to either: schedule connections I and II coincidently in time using non-adjacent frequency channels or, schedule connections I and II sequentially in time using any frequency channels. In the context of this embodiment, FIG. 18 graphically illustrates the scheduler algorithm's task. The scheduler algorithm selects wireless TDMA timeslots, FDMA channels, and transmitter power levels so as to maximize QOS metrics and minimize blocking while satisfying constraints such as those indicated above. The arrows to the right of the ICWTs (42) illustrate a time and frequency selection example. The output of the algorithm is a routing table filled with routing table entries as illustrated in FIG. 17.

In the interest of maintaining low costs, Wireless PHY and MAC/LCC layers of the ICWT (42) (as illustrated in FIG. 14) can be realized from off-the-shelf FCC Ultra-Wide-Band and/or IEEE 802.15.3a compliant integrated circuits. Alternatively, a system on chip realization can be built in a manner that is known from off-the-shelf FCC Ultra-Wide-Band and/or IEEE 802.15.3a compliant soft cores and hard cores amenable to IC fabrication, in a manner that is readily apparent to those skilled in the art.

Second Planar Embodiment

Figure 19A:
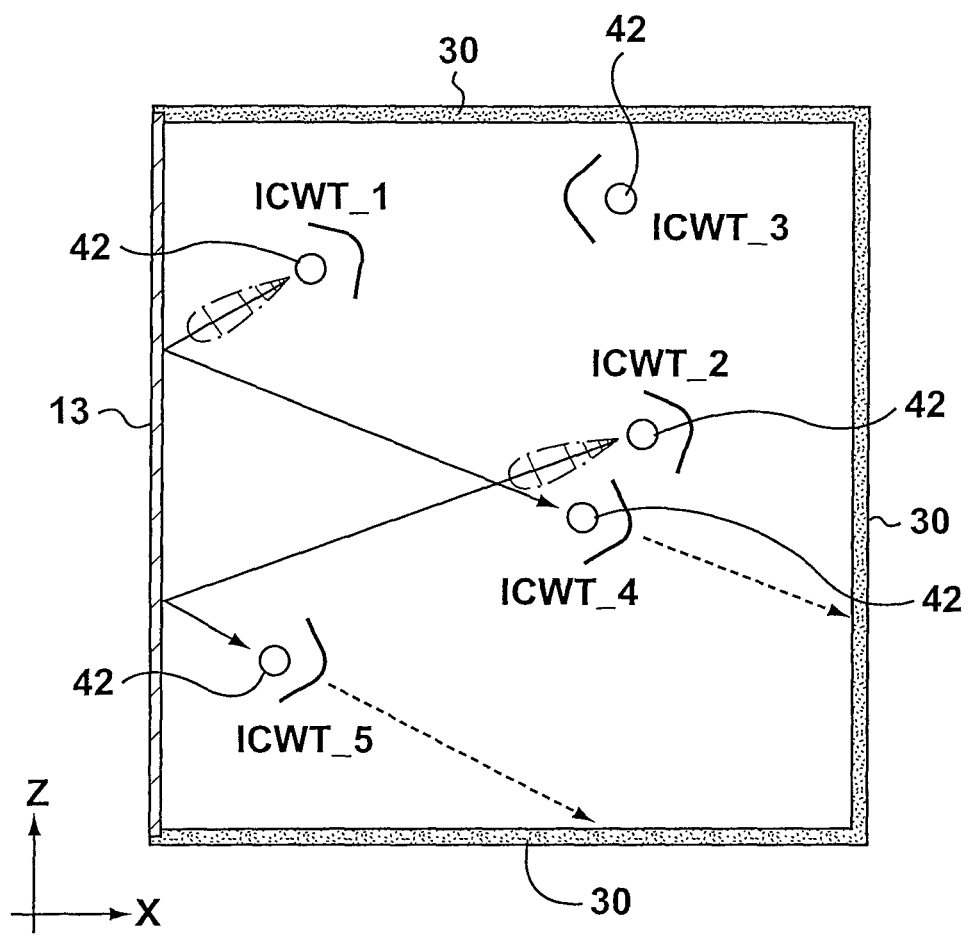
FIG. 19a illustrates the operation of the planar RF/microwave chamber of the present invention with five electrically steerable directional ICWTs.

In the embodiment of FIG. 19*a*, the planar RF/microwave chamber (12) employs two proximate parallel plates separated in the "Y" direction by at least ½ of the wavelength of the lowest signal frequency component (as explained above). Three of the perimeter facets (30) are constructed from RF/microwave absorptive material and the fourth facet (13) is constructed from RF/microwave reflective material. The RF/microwave chamber (12) air medium is subdivided into space, code, and time channels. Frequency and polarization division multiplexing are not utilized in this embodiment.

Electrically and dynamically steerable MIMO radiating units (22) linearly polarized in the "Y" direction are employed as part of the ICWTs (42) and radiation propagation is confined within the XZ plane of the planar RF/microwave chamber (12). For illustrative purposes 5 ICWTs (42) are shown in FIG. 19a.

Time channels are further subdivided into contention and contention free channel types. Contention channels are used to convey low bandwidth control information among ICWTs (42) for initialization, synchronization, and management while contention free time channels are allocated by the scheduler (48) to establish deterministic connectivity among ICWT (42) units. Time channels are organized into frames where each frame or collection of frames is demarcated by a beacon signal which is used for synchronization, in a manner that is known.

To illustrate scheduler (48) functionality, as before, assume two connection requests are made of the scheduler (48): ICWT_1 transmits to ICWT_4, and ICWT_2 transmits to ICWT_5.

When contemplating coincidental scheduling of these connections, the following observations are made: (A) For direct sequence spread spectrum code division multiplexing with good QOS, the unintentional signal power received by ICWT_4 from ICWT_2 must be less than or equal to the intentional signal power received by ICWT_4 from ICWT_1. (B) In a line of sight (LOS) connection from ICWT_1 to ICWT_4, and from ICWT_2 to ICWT_5, a portion of ICWT_2's power will be received by ICWT_4. The portion of signal power received by ICWT_4 from ICWT_2 relative to ICWT_1 is a function of the beam width of the ICWTs and the relative distances of the two transmitters. For a given error rate QOS metric, a narrower ICWT (42) beam width can tolerate a greater ratio of ambient unintentional to intentional transmit power. (C) In the embodiment of the invention illustrated in FIG. 19a, to permit coincident code multiplexing and/or to maximize the error rate QOS metric, the scheduler (48) is operable to increase spatial isolation by reflecting both transmit signals off of the reflective facet (13). (D) Alternatively, if the ICWT's (42) beam width had proven too wide and/or the interferer proximity too close to support the desired error rate QOS metric, then the scheduler (48) would have had to schedule the connections sequentially in time.

Figure 20:
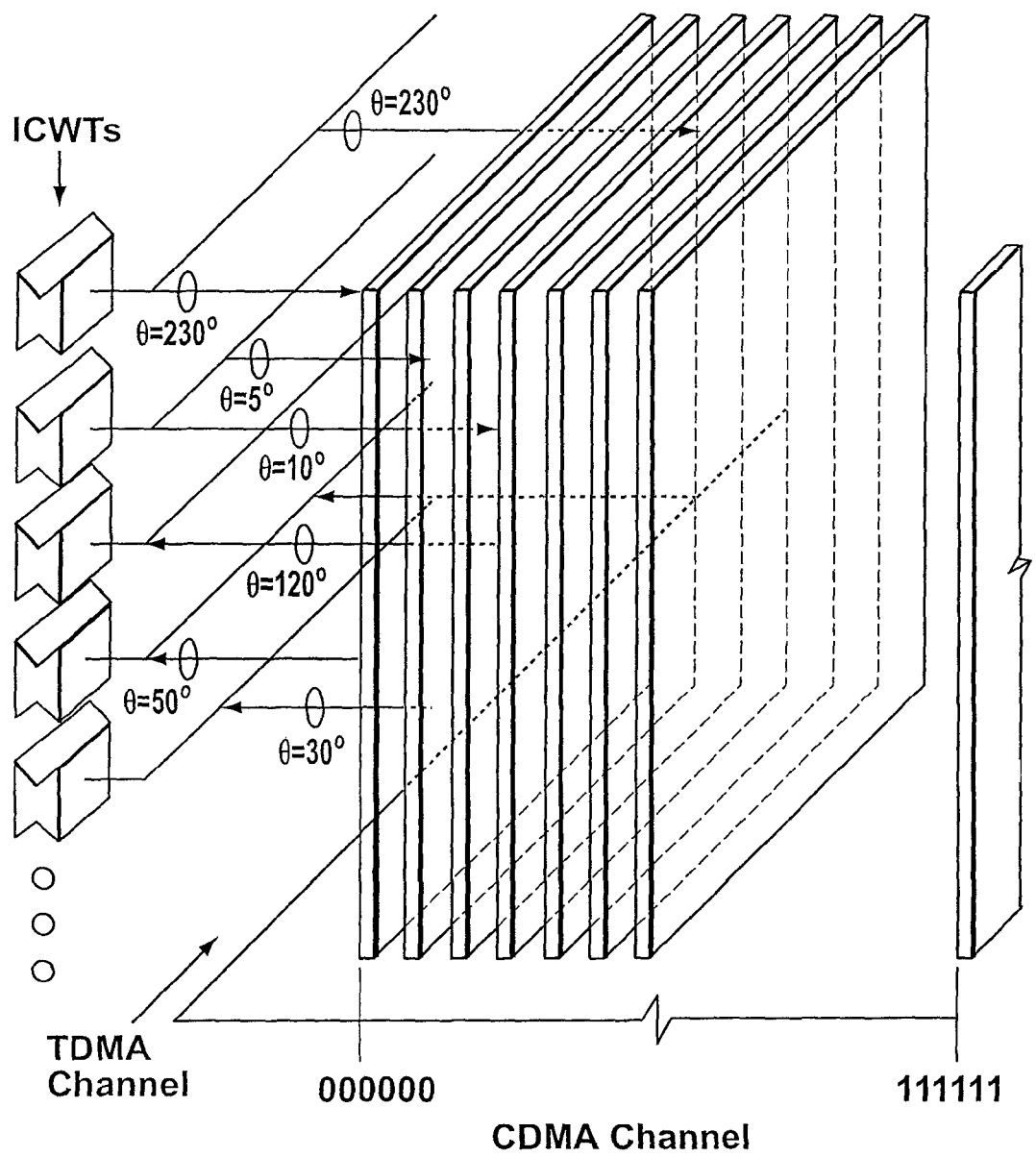
FIG. 20 illustrates the operation of the ICWT's for the purpose of allocation of TDMA, CDMA, and SDMA channels within the planar RF/microwave chambers of the present invention.

In the context of this embodiment, FIG. 20 graphically illustrates the scheduler algorithm's task. The scheduler algorithm selects wireless TDM timeslots, CDMA channels, SDMA channels (i.e. radiation unit directivity), and transmitter power levels so as to maximize QOS metrics, minimize blocking while satisfying constraints such as those indicated above. The arrows to the right of the ICWTs illustrate a time and code selection with the angular annotation indicating the transmitter direction orientation in counterclockwise rotation relative to the positive "X" axis. The output of the algorithm is a routing table filled with routing table entries as illustrated in FIG. 17.

The present invention also contemplates another embodiment of the ICWT (42) illustrated in FIG. 14, in which the ICWT (42) also includes a buffer memory block (not specifically shown) capable of temporary storage of wireless ingress data intended for future transmission back into the RF/microwave chamber (12). In this particular embodiment, the scheduler (48) is operable to schedule a "store and forward" relay operation in addition to all other functionality previously identified. This permits the ICWT (42) to increase the RF/microwave chamber (12) communication capacity by allowing the scheduling of connections through an intermediary "store and forward" node. This is best illustrated by way of example.

Figure 19B:
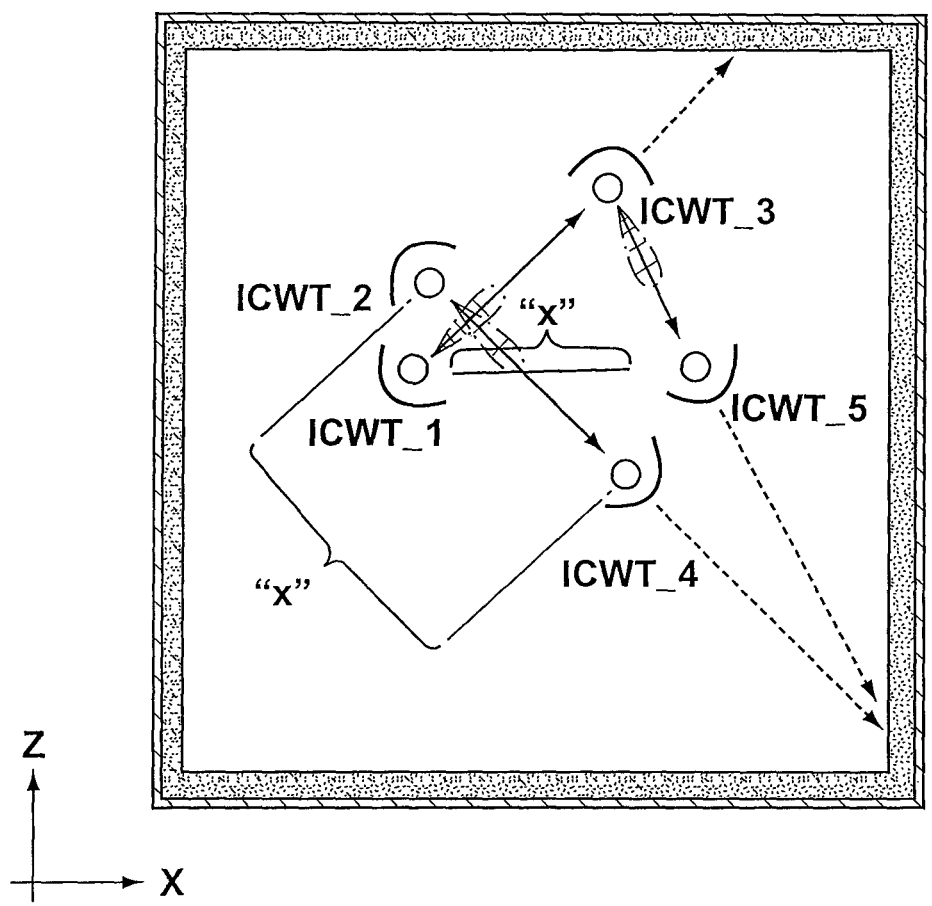
FIG. 19b illustrates the operation of the planar RF/microwave chamber of the present invention also with five electrically steerable directional ICWTs, in another configuration of the ICWTs.

In FIG. 19b the radiating units (22) of the various ICWTs (42) have a 90 degree 3 dB beamwidth, are directionally steerable, and disposed in a planar RF/microwave chamber (12). Direct sequence spread spectrum CDMA is employed and the following connections require allocation by the scheduler (48):

ICWT_2 transmits to ICWT_4
ICW_1 transmits to ICWT_5

The scheduler would like to allocate both connections coincident in time and frequency but is unable to do so due to interference. ICWT_4 and ICWT_5 are the same radial distances ("x") away from ICWT_2 and will therefore receive the same signal strength from ICWT_2. The distance between ICWT_1 and ICWT_5 is also "x". For direct sequence spread spectrum CDMA to function properly, the receive power of the intentional signal must be greater than or equal to the receive power of the unintentional interfering signal. It follows then that if ICWT_5 is to receive ICWT_1, the transmit power of ICWT_1 must be equal or greater than that of ICWT_2. Unfortunately, under this condition ICWT_4 will receive more unintentional signal from ICWT_1 than intentional signal form ICWT_2.

A solution lies in the scheduler's (48) ability to employ the services of the "store and forward" capable ICWT_3. In FIG. 19b, the scheduler (48) allocates the transmission of ICWT_1's signal to the intermediary ICWT_3, with ICWT_3 subsequently transmitting the received signal to ICWT_5. In this case ICWT_1's signal is directed away from ICWT_4 so as not to interfere with ICWT_4's receipt of ICWT_2's signal. Likewise, ICWT_2's signal is directed away ICWT_3 so as not to interfere with ICWT_3's receipt of ICWT_1's signal. ICWT_5's receive signal strength of ICWT_3's signal must be equal or greater than the receive signal strength of ICWT_2's unintentional signal. If ICWT_3's transmit power is such that ICWT_5's receive signal strength of both ICWT_2 and ICWT_3 signals is the same then ICWT_4 will receive less unintentional signal power from ICWT_3 than intentional signal power from ICWT_2. All constraints are therefore met and with the assistance of ICWT_3, the scheduler (48) is able to allocate ICWT_1 to ICWT_5 and ICWT_2 to ICWT_4 connections coincident in time. It should be noted, however, that the deployment ICWT_3 introduces additional latency in the ICWT_1 to ICWT_5 connection. This treatment has assumed that the added latency is acceptable. It is possible that the ICWT_1 to ICWT_5 connection may have an associated latency QOS constraint that would preclude this solution. In this case the scheduler (48) might consider directing the ICWT_2 to ICWT_4 connection through ICWT_3 if the added latency is acceptable.

In summary, the store and forward capability of ICWT_3, illustrated in FIG. 19b, has enhanced the communication capacity of the RF/microwave chamber (12) by allowing coincident scheduling of two independent communications which would otherwise not be possible.

Figure 19C:
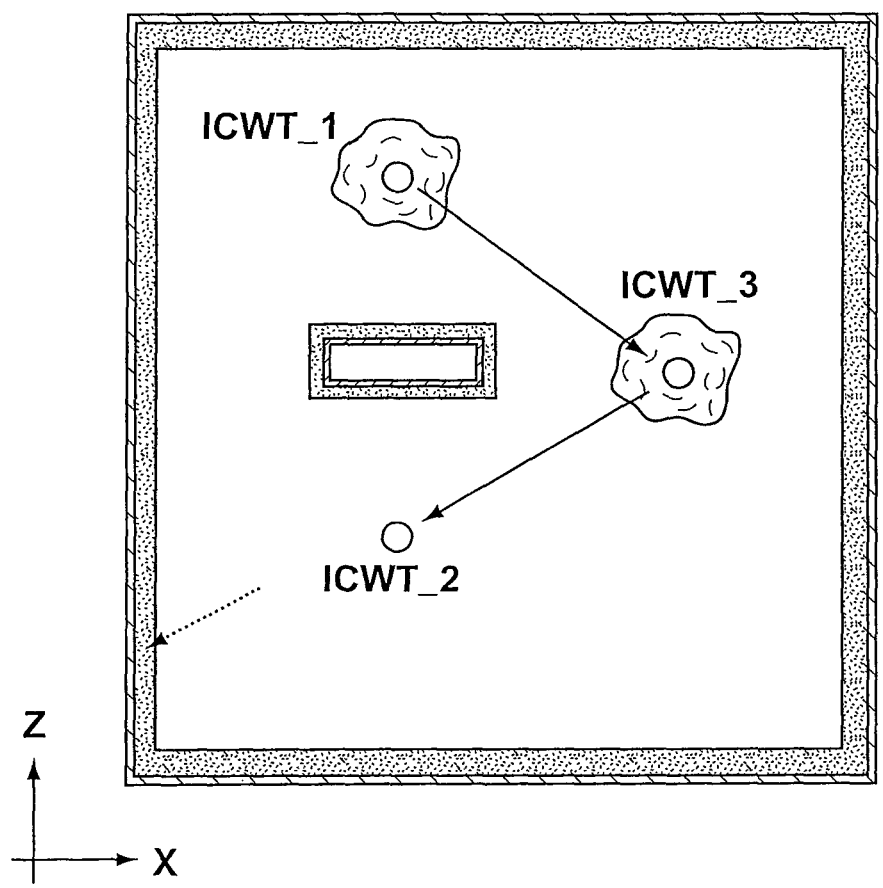
FIG. 19c illustrates the operation of the planar RF/microwave chamber of the present invention with in the presence of an obstacle to communication within the chamber.

The store and forward ICWT enhancement also permits for the routing of connections around an obstacle. Consider the RF/microwave chamber (12) of FIG. 19c. ICWT_1 is unable to communicate directly with ICWT_2 without the assistance of ICWT_3. In this capacity ICWT_3 may be viewed as an intelligent reflector: it receives information from ICWT_1 and relays it to ICWT_2. The obstacle of FIG. 19c can be permanent such as a passage duct in a midplane embodiment, or temporary such as the insertion or removal of a circuit pack card in a frontplane embodiment. A store and forward ICWT (42) is also useful in facilitating signal routing in a non-convex RF/microwave chamber (12). As stated earlier, in the interest of maintaining low cost, the Wireless PHY and MAC/

LCC layers of the ICWT (42) can be realized from off-the-shelf FCC Ultra-Wide-Band and/or IEEE 802.15.3a compliant integrated circuits in a manner that is known. Alternatively, a system on chip realization can be built from off-the-shelf FCC Ultra-Wide-Band and/or IEEE 802.15.3a compliant soft cores and hard cores amenable to IC fabrication, in a manner that is known. MIMO functionality is currently not part of the 802.15.3a specification and would therefore need to be realized independently.

Other variations and modifications of the invention are possible. For example, The first planar embodiment could be modified by eliminating the FDMA channelization. In this embodiment channelization would occur in the time domain only. The first planar embodiment could be modified by eliminating the TDMA channelization. In this embodiment, for "N" ICWTs, "N−1" or more FDMA channels would be set aside to relay low bandwidth control information among all ICWTs. Two-way communication could be conducted using either Time Division Duplex (TDD) within a frequency channel, Frequency Division Duplex (FDD) among different frequency channels, or both. The first planar embodiment could be enhanced by replacing the omni-directional radiating units with MIMO radiating units thereby permitting the addition of spatial division multiplexing within the RF/microwave chamber. Also, the RF/microwave chamber described above could utilize additional reflective facets to increase the RF/microwave chamber's communication capacity.

The second planar embodiment could be modified by substituting the TDMA channelization for FDMA channelization. In this embodiment either FDMA channels or a combination of CDMA and FDMA channels would be set aside to relay low bandwidth control information among all ICWTs. Two-way communication could be conducted using either Time Division Duplex (TDD) within a frequency or code division channel, Frequency Division Duplex (FDD) among different frequency channels, or both. The second planar embodiment could be modified by eliminating CDMA channelization. The second planar embodiment could also be modified by eliminating the reflector. The second planar embodiment could be further modified by replacing the MIMO radiating units with omni-directional radiating units thereby eliminating SDMA channelization. The second planar embodiment can be enhanced by adding FDMA channelization. In a preferred embodiment, channelization occurs by first subdividing the RF/microwave chamber spectrum into frequency channels. Each subdivided frequency channel is further channelized in time. Finally, each time channel is further channelized in code. It should also be understood that the elements of the first and second planar embodiments described above can be readily modified to apply to three-dimensional (i.e. non-planar) RF/microwave chamber realizations, for example, by situating radiating units such that they are not constrained to a single plane but rather are dispersed within the RF/microwave chamber such that intra-cabinet communication is achieved by spatial directivity characterized by azimuth and elevation angles, in a manner that is known. Similarly, the present invention exemplified by the first and second planar embodiments described above is also applicable to one dimensional (i.e. non-planar) RF/microwave chamber realizations, for example, by confining radiating units to a line and spatial directivity characterized by a binary direction (e.g. left or right, up or down etc.). The first and second planar embodiments along with all modifications, enhancements, and variants cited above may be enhanced with PDMA channelization. The polarization domain can be divided into linearly orthogonal horizontal and vertical components, or elliptically orthogonal clockwise and counterclockwise components.

While the present invention is primarily concerned with inter-communication between components stored in a cabinet, the concept of the RF/microwave chamber enclosing radiating elements and the management of communication between the radiating elements by operation of the wireless transceiver of the present invention can be applied in other areas. One example is inside a vehicle. The outer body panels and treated glass can be modified to serve as an RF shield; the treated glass can also serve as an inner reflector; and the inner upholstery and carpeting can be designed to have RF absorptive properties. This technology could be useful to effectively disseminate a multitude of different intrinsic and extrinsic multimedia signals among occupants confined within the vehicle with little worry of interference from outside sources (i.e. other similarly equipped vehicles passing by). The technology would support mobile devices (e.g. MP3 and DVD players suitably equipped with ICCUs) as they entered and exited the inner confines of the vehicle. The scheduler of the present invention would allocate channels appropriately. The present invention would be particularly useful as it relates to deployment of an entertainment system in a bus or train, for example.

All such modifications or variations are believed to be within the sphere and scope of the invention as defined by the claims appended hereto.

The embodiments of the invention in which an exclusive property or privilege is claimed are defined as follows:

1. A method of linking an assembly of electronic components disposed inside a cabinet for wireless communication therebetween comprising selecting a plurality of the electronic components for inter-communication therebetween, and linking each of the plurality of electronic components, directly or indirectly, to a wireless multi-link device, the wireless multi-link device including one or more radiating elements; characterised by the steps of:
   (a) providing an RF/microwave chamber within or adjacent to the cabinet, the dimensions of which are optimized to promote signal propagation inside the RF/microwave chamber, whereby the RF/microwave chamber is operable to substantially confine signals emitted by the radiating elements within the RF/microwave chamber and signals not contained within said chamber are converted at a radiating element interface;
   (b) confining the radiating elements within the RF/microwave chamber;
   (c) connecting the wireless multi-link devices to a wireless medium that is operable within an air medium of the RF/microwave chamber; and
   (d) activating the wireless multi-link devices to inter-communicate via the wireless medium by operation of the radiating elements.

2. The method of claim 1 further characterised in that the RF/microwave chamber dimensions are optimized so that such dimensions include at least one dimension that is greater than or substantially equal to $^x\!A$ the wavelength of the lowest signal frequency of the wireless multi-link devices.

3. The method of claim 1 further characterised in that the minimum cross-sectional dimensions perpendicular to and averaged over each possible signal trajectory within the RF/microwave chamber are greater than or substantially equal to lambda/2.

4. The method of claim 3 further characterised in that the minimum cross-sectional dimensions perpendicular to and averaged over each possible signal trajectory within the RF/microwave chamber is not less than Vi of lambda/2 minus fifteen percent.

5. The method of claim 1 further characterised by the steps of substantially shielding the interior of the RF/microwave chamber from outside RF/microwave interference, and substantially preventing signals from escaping from the RF/microwave enclosure.

6. The method of claim 5 further characterised in that the RF/microwave chamber shields the interior thereof.

7. The method claimed in claim 5 further characterised in that the RF/microwave chamber substantially absorbs incident electromagnetic energy at the frequency range of operation of the wireless multi-link devices.

8. The method of claim 1 further characterised by the step of providing at least one absorptive facet in the interior of the RF/microwave chamber to reduce multi-path signal distortion.

9. The method of claim 8 further characterised by the step of using at least one reflective facet in combination with the at least one absorptive facet to facilitate increased intra-cabinet communication capacity by so disposing the at least one reflective facet so as to effect communication between the one or more radiating elements.

10. The method of claim 1 further characterised by the step of providing at least one facet within the RF/microwave chamber that includes frequency selective material having selective signal absorption/reflection properties.

11. The method of claim 1 further characterised by the step of dividing the air medium into multiple logical channels by operation of a wireless transceiver.

12. The method of claim 1 further characterised by the step of selectively or non-selectively reflecting signals inside the RF/microwave chamber so as to enable one or more of the following steps:
    (a) directing electromagnetic signals around an obstruction;
    (b) enhancing the RF/microwave chamber communication capacity due to increased spatial multiplexing where the wireless multi-link devices include directional radiating elements;
    (c) reducing a three dimensional RF/microwave chamber to a planar or linear RF/microwave chamber; and/or
    (d) operating as a waveguide.

13. A wireless multi-linking system for enabling electronic components disposed inside a cabinet to inter-communicate wirelessly comprising a plurality of wireless multi-link devices linked, directly or indirectly, to a plurality of the electronic components, the wireless multi-link devices including one or more radiating elements, characterised in that an RF/microwave chamber within or adjacent to the cabinet, the dimensions of which are optimized to promote signal propagation inside the RF/microwave chamber, wherein the RF/microwave chamber is disposed so as to confine the radiating elements and is operable to substantially confine signals emitted by the radiating elements within the RF/microwave chamber and signals not contained within said chamber are converted at a radiating element interface; wherein the wireless multi-link devices are operable to connect to a wireless medium provided within the RF/microwave chamber and to intercommunicate via the wireless medium by operation of the radiating elements, thereby enabling inter-communication between the plurality of electronic components.

14. The system of claim 13 further characterised in that the RF/microwave chamber dimensions are optimized so that such dimensions include at least one dimension that is greater than or substantially equal to Vi the wavelength of the lowest signal frequency of the wireless multi-link devices.

15. The system of claim 14 further characterised in that the minimum cross-sectional dimensions perpendicular to and averaged over each possible signal trajectory within the RF/microwave chamber are greater than or substantially equal to lambda/2.

16. The system of claim 15 further characterised in that the minimum cross-sectional dimensions perpendicular to and averaged over each possible signal trajectory within the RF/microwave chamber is not less than $^1Z$- of lambda/2 minus fifteen percent.

17. The system of claim 13 further characterised in that the system comprises a shield that is operable to shield substantially the interior of the RF/microwave chamber from outside RF/microwave interference, and prevent substantially signals from escaping from the RF/microwave chamber.

18. The system of claim 17 further characterised in that the shield forms part of the RF/microwave chamber.

19. The system of claim 13 further characterised in that the wireless multi-link devices includes a transceiver.

20. The system of claim 19 further characterised in that the wireless multi-link devices are structured to be mounted on circuit packs disposed inside the cabinet.

21. The system of claim 20 further characterised in that the cabinet includes a plurality of card cages for receiving one or more circuit packs, and wherein the wireless multi-link devices are operable to enable inter-communication between the electronic components whether they are disposed in the same card cage or another card cage disposed within the RF/microwave chamber.

22. The system of claim 13 further characterised in that the radiating elements are operable to utilize spatial multiplexing to improve the communication capacity within the RF/microwave chamber.

23. The system of claim 13 further characterised in that the RF/microwave chamber includes an interior, and the interior includes at least one absorptive facet to reduce multi-path signal distortion inside the RF/microwave chamber.

24. The system of claim 23 further characterised in that the interior of the RF/microwave chamber further includes at least one reflective facet that is operable to cooperate with the at least one absorptive facet to facilitate increased intra-cabinet communication capacity as the at least one reflective facet is so disposed inside the RF/microwave chamber so as to effect communication between the one or more radiating elements.

25. The system of claim 13 further characterised in that the inside of the RF/microwave chamber includes one or more facets that are operable to selectively or non-selectively reflect signals inside the RF/microwave chamber such that the RF/microwave chamber is operable to do one or more of the following:
    (a) direct electromagnetic signals around an obstruction;
    (b) enhance the RF/microwave chamber communication capacity due to increased spatial multiplexing where the wireless multi-link devices include directional radiating elements;
    (c) reduce a three dimensional RF/microwave chamber to a planar or linear RF/microwave chamber; and/or
    (d) operate as a waveguide.

26. The system claimed in claim 13 further characterised in that the RF/microwave chamber is disposed adjacent to the front of the cabinet, wherein the walls of the RF/microwave chamber are provided so that:
    (a) a first wall is provided by the door of the cabinet, the door including a conductive material;

(b) a second wall is provided opposite to the cabinet door, which second wall includes the face plates of the various circuit packs, and which second wall presents a substantially conductive surface; and (c) four perimeter walls disposed between the first wall and the second wall, and connecting the first wall and the second wall;

wherein the distance between the first wall and the second wall is greater than Vi the wavelength of the lowest signal frequency of each of the wireless multi-link devices at their range of operation.

27. The system of claim 26 further characterised in that the wireless multi-link device is a single-input-single-output (SISO) type device and the inside of the four perimeter walls within the RF/microwave chamber includes absorptive material.

28. The system of claim 26 further characterised in that the wireless multi-link device is a multiple-input-multiple-output (MIMO) type device and the inside of the four perimeter walls within the RF/microwave chamber includes absorptive material and/or reflective material.

29. The system of claim 13 further characterised in that the transceiver is operable to selectively boost or diminish power to each of the radiating elements so as to effect communication between the plurality of wireless multi-link devices.

30. The system as claimed in claim 28 further characterised in that the MIMO type device is steerable by operation of the transceiver so as to focus and steer the incoming and outgoing radiation pattern of the wireless multi-link device.

31. The system as claimed in claim 13 further characterised in that the RF/microwave chamber is disposed between two substantially parallel groups of circuit packs.

32. The system as claimed in claim 13 further characterised in that the RF/microwave chamber is disposed at the back of the cabinet behind a group of circuit packs.

33. The system as claimed in claim 13 further characterised in that the system comprises a plurality of interconnected RF/microwave chambers.

34. The system as claimed in claim 13 further characterised in that the transceiver is operable to divide the air medium within the RF/microwave chamber into multiple logical channels.

35. A wireless transceiver for managing wireless interconnection between a plurality of wired electronic components comprising a wired interface that permits the exchange of electrical signals conveying both control and payload information between a host and the wireless transceiver, characterised in that the transceiver comprises:

(a) a wireless interface that is operable to link to one or more single-input-single-output and/or multiple-input-multiple-output radiating units disposed within a confined area having an air medium;

(b) a communication management utility linked to the wired interface and to the wireless interface that is operable to:

(i) channelize and multiplex signal related information within time division and spatial division domains (including synchronization and framing information);

(ii) enable multipoint-to-multipoint communication on one or more contention channels, and point-to-point or point-to-multipoint communication on one or more contention free channels, such channels being defined in the air medium;

(iii) facilitate channelizing and multiplexing of channelized signal related information within time, frequency, code, space and polarization domains including synchronization and framing information; and (iv) facilitate the allocation of wired and wireless channel resources (time, frequency, space, code, and polarization) in a manner so as to establish efficient and effective connectivity among the wireless multi-link devices.

36. A wireless transceiver for managing wireless interconnection between a plurality of wired electronic components comprising a wired interface that permits the exchange of electrical signals conveying both control and payload information between a host computer and the wireless transceiver, characterised in that the transceiver comprises:

(a) a wired media access and controller utility linked to the wired interface that is operable to channelize and multiplex signal related information within time division and spatial division domains (including synchronization and framing information);

(b) a wireless interface that is operable to link to one or more single-input-single-output and/or multiple-input-multiple-output radiating units disposed within a confined area having an air medium;

(c) a wireless media access and controller utility linked to the wireless interface that is operable to enable multipoint-to-multipoint communication on one or more contention channels, and point-to-point or point-to-multipoint communication on one or more contention free channels, such channels being defined in the air medium;

(d) a link layer controller that is linked to the wireless interface that facilitates channelizing and multiplexing of channelized signal related information within time, frequency, code, space and polarization domains including synchronization and framing information; and (e) a scheduler utility that is linked to the wired media access and controller utility and to the wireless media access and controller utility, and that facilitates the allocation of wired and wireless channel resources (time, frequency, space, code, and polarization) in a manner so as to establish efficient and effective connectivity among the wireless multi-link devices.

37. A circuit pack for placement in a cabinet characterised in that the circuit pack comprises the wireless transceiver of claim 36.

38. A method of linking an assembly of electronic components for enabling wireless communication therebetween comprising selecting a plurality of the electronic components for inter-communication therebetween, and linking each of the plurality of electronic components, directly or indirectly, to a wireless multi-link device, the wireless multi-link device including one or more radiating elements, characterised by the steps of:

(a) providing an RF/microwave chamber within or adjacent to the assembly of electronic components, the dimensions of which are optimized to promote signal propagation inside the RF/microwave chamber, whereby the RF/microwave chamber is operable to substantially confine signals emitted by the radiating elements within the RF/microwave chamber; confining the radiating elements within the RF/microwave chamber and signals not contained within said chamber are converted at a radiating element interface;

(b) connecting the wireless multi-link devices to a wireless medium that is operable within an air medium of the RF/microwave chamber; and (c) activating the wireless multi-link devices to inter-communicate via the wireless medium by operation of the radiating elements.

* * * * *